United States Patent
Morimoto

(10) Patent No.: US 7,907,077 B2
(45) Date of Patent: Mar. 15, 2011

(54) PIPELINED A/D CONVERTER

(75) Inventor: Yasuo Morimoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 31 days.

(21) Appl. No.: 12/463,833

(22) Filed: May 11, 2009

(65) Prior Publication Data

US 2010/0007542 A1    Jan. 14, 2010

(30) Foreign Application Priority Data

Jul. 14, 2008  (JP) ................................ 2008-182437

(51) Int. Cl.
    *H03M 1/38* (2006.01)
(52) U.S. Cl. ....................................... 341/161; 341/155
(58) Field of Classification Search ................. 341/118, 341/120, 155, 172, 161
    See application file for complete search history.

(56) References Cited

U.S. PATENT DOCUMENTS

| | | | |
|---|---|---|---|
| 6,839,009 B1 * | 1/2005 | Ali | 341/118 |
| 6,987,477 B1 * | 1/2006 | Aude | 341/161 |
| 7,030,804 B2 | 4/2006 | Yoshioka et al. | |
| 7,595,744 B2 * | 9/2009 | Agarwal et al. | 341/118 |

FOREIGN PATENT DOCUMENTS

JP    2006-086981    3/2006

OTHER PUBLICATIONS

Hiroki Endou et al., "A study on the multi-bit-pipelined A/D converter," IEICE Tech. Report, vol. 106, No. 189, ICD2006-63 pp. 17-22, 2006 with English Translation.

* cited by examiner

*Primary Examiner* — Brian Young
(74) *Attorney, Agent, or Firm* — McDermott Will & Emery LLP

(57) ABSTRACT

The present invention aims to provide a pipeline type A/D converter capable of realizing low power consumption while preventing a reduction in feedback factor of an amplifier. One embodiment of the present invention is of a pipeline type A/D converter which converts an analog signal to a digital signal, including a plurality of stages coupled in tandem and an error correction circuit which generates the digital signal, based on sub digital signals respectively outputted from the stages. When a sub digital signal of N bits is outputted at least one of the stages in the pipeline type A/D converter according to the one embodiment of the present invention, the stage gain of a transfer function becomes $2^{N-K-1}$, the number of returns becomes $2^N-2$ and an integer K has a relation of $1 \leq K \leq N$.

12 Claims, 28 Drawing Sheets

PIPELINED A/D CONVERTER

CROSS-REFERENCE TO RELATED APPLICATIONS

The disclosure of Japanese Patent Application No. 2008-182437 filed on Jul. 14, 2008 including the specification, drawings and abstract is incorporated herein by reference in its entirety.

BACKGROUND OF THE INVENTION

The present invention relates to a pipeline type A/D converter, and particularly to a pipeline type A/D converter having multi-bit pipeline stages.

With the development of a system LSI technology in recent years, it became possible to mount a large scale system onto one LSI. A data converter used for the input/output of an analog signal becomes absolutely essential for such a system LSI. Particularly since an A/D converter employed in the system LSI has frequently been inputted with a plurality of various information such as signals and image signals from a sensor and wireless or radio signals, it is not uncommon that a plurality of A/D converters are mounted onto the system LSI.

When the plural A/D converters are mounted on the system LSI, a pipeline A/D converter has recently been used frequently from the need to place the same on a limited area. This pipeline A/D converter is excellent in not only an exclusive area but also power consumption. Further, a reduction in the area and low power consumption have been required therefor. A pipeline type A/D converter (called also "multi-bit pipeline type A/D converter") having multi-bit pipeline stages has been researched and developed as shown in a non-patent document 1 (Study of Multi-Bit Pipeline Type A/DC (Endo et al., Institute of Electronics, Information and Communication Engineers, 2006, ICD)).

The multi-bit pipeline type A/D converter is an extension of the conventionally well-known 1.5-bit type pipeline and is equivalent to one in which an arithmetic operation of each pipeline stage is expanded from 1 bit to plural bits. The pipeline type A/D converter has advantages in that since the number of bits per stage is large, the number of stages can be reduced, and a shift or displacement in stage gain that has become a problem upon a pipeline configuration like the influence of a capacitance mismatch and the like can be reduced.

SUMMARY OF THE INVENTION

The multi-bit pipeline type A/D converter has a problem in that since the stage gain increases as multi-biting thereof progresses, a feedback factor is reduced. With the reduction in the feedback factor, a unity gain frequency at an output node of an amplifier becomes high inevitably, so that the amplifier needs to have a high frequency characteristic or response. Therefore, a device size increases in order to improve the characteristic of the amplifier and the parasitic capacitance increases. A problem also arises in that current consumption of the amplifier cannot be reduced.

Therefore, the present invention aims to provide a pipeline type A/D converter capable of realizing low power consumption while preventing a reduction in feedback factor of an amplifier.

One embodiment of the present invention is of a pipeline type A/D converter that converts an analog signal to a digital signal, including a plurality of stages coupled in tandem and an error correction circuit which generates the digital signal, based on sub digital signals respectively outputted from the stages. When a sub digital signal of N bits is outputted at at least one of the stages in the pipeline type A/D converter according to the one embodiment of the present invention, the stage gain of a transfer function becomes $1^{N-K-1}$, the number of returns becomes $2^N-2$ and an integer K has a relation of $1 \leq K \leq N$.

Since the stage gain of the transfer function becomes $2^{N-K-1}$, the number of returns becomes $2^N-2$ and the integer K has the relation of $1 \leq K \leq N$, the pipeline type A/D converter described in one embodiment of the present invention has an advantageous effect in that low power consumption can be realized while a reduction in feedback factor of an amplifier is being prevented.

DETAILED DESCRIPTION OF THE PREFERRED EMBODIMENTS

First Embodiment

Figure 1:
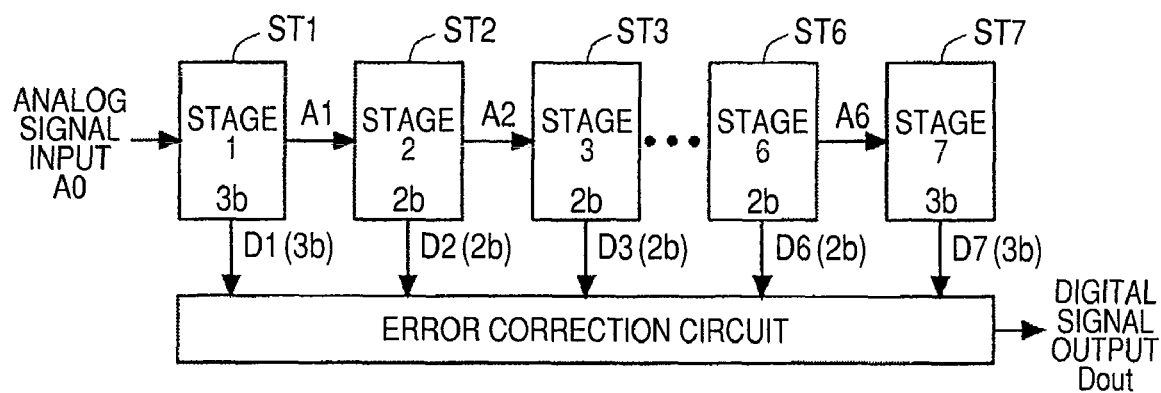
FIG. 1 is a block diagram of a pipeline type A/D converter according to a first embodiment of the present invention.

A block diagram of a multi-bit pipeline type A/D converter according to a first embodiment is shown in FIG. 1. The pipeline type A/D converter shown in FIG. 1 includes seven stages ST1 through ST7 coupled in tandem and an error correction circuit 1.

An analog signal A) to be A/D converted is inputted to the stage ST1 corresponding to a first stage. The stage ST1 generates a 3-bit digital signal D1 (3 b), based on the analog signal A) and outputs it to the error correction circuit 1. The stage ST1 generates an analog signal A1 having a level corresponding to each of the analog signal A) and the digital signal D1 and outputs it to the stage ST2 corresponding to the following stage.

The stage ST2 generates a 2-bit digital signal D2 (2 b), based on the analog signal A1 outputted from the stage ST1 and outputs it to the error correction circuit 1. The stage ST2 generates an analog signal A2 having a level corresponding to each of the analog signal A1 and the digital signal D2 and outputs it to the stage ST3 corresponding to the following stage. Each of the stages ST3 through ST6 corresponding to the three to sixth stages is similar in configuration to the stage ST2.

The stage ST7 corresponding to a final stage generates a 3-bit digital signal D7 (3 b), based on the analog signal A6 outputted from the stage ST6 corresponding to the previous stage and outputs it to the error correction circuit 1. The error correction circuit 1 outputs a final digital signal $D_{out}$, based on the digital signals D1 through D7 outputted from the stages ST1 through ST7 respectively.

Figure 2:
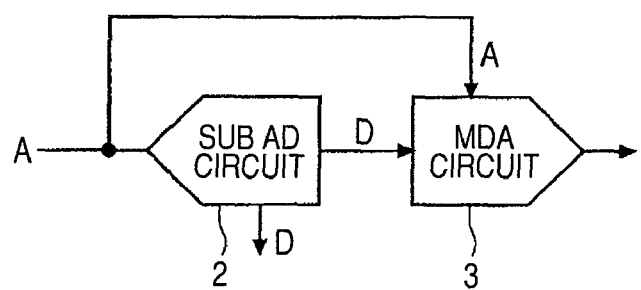
FIG. 2 is a block diagram of a stage being a premise of the pipeline type A/D converter according to the first embodiment of the present invention.

Each of the stages that configure the pipeline type A/D converter according to the present embodiment is equipped with a sub AD circuit 2 and a D/A circuit (MDA circuit 3) called "MDAC (Multiplying DAC)" as shown in FIG. 2. In such a stage as shown in FIG. 2, the sub AD circuit 2 brings the analog signal A into digital form and outputs a digital signal D. Since the convertible accuracy of the analog signal to the digital signal by the sub AD circuit 2 is a few bits or so, the converted digital signal D differs greatly from the analog signal A.

Therefore, the MDA circuit 3 subtracts an analog value equivalent to the digital portion converted by the sub AD circuit 2 from the analog signal A, based on the digital signal D and the analog signal A thereby to determine a conversion error (analog value) that cannot be brought into conversion by the sub AD circuit 2. Further, the MDA circuit 3 multiplies the so-obtained conversion error by predetermined stage gain (two to several times) thereby to amplify it to facilitate its conversion at a subsequent stage.

Figure 3:
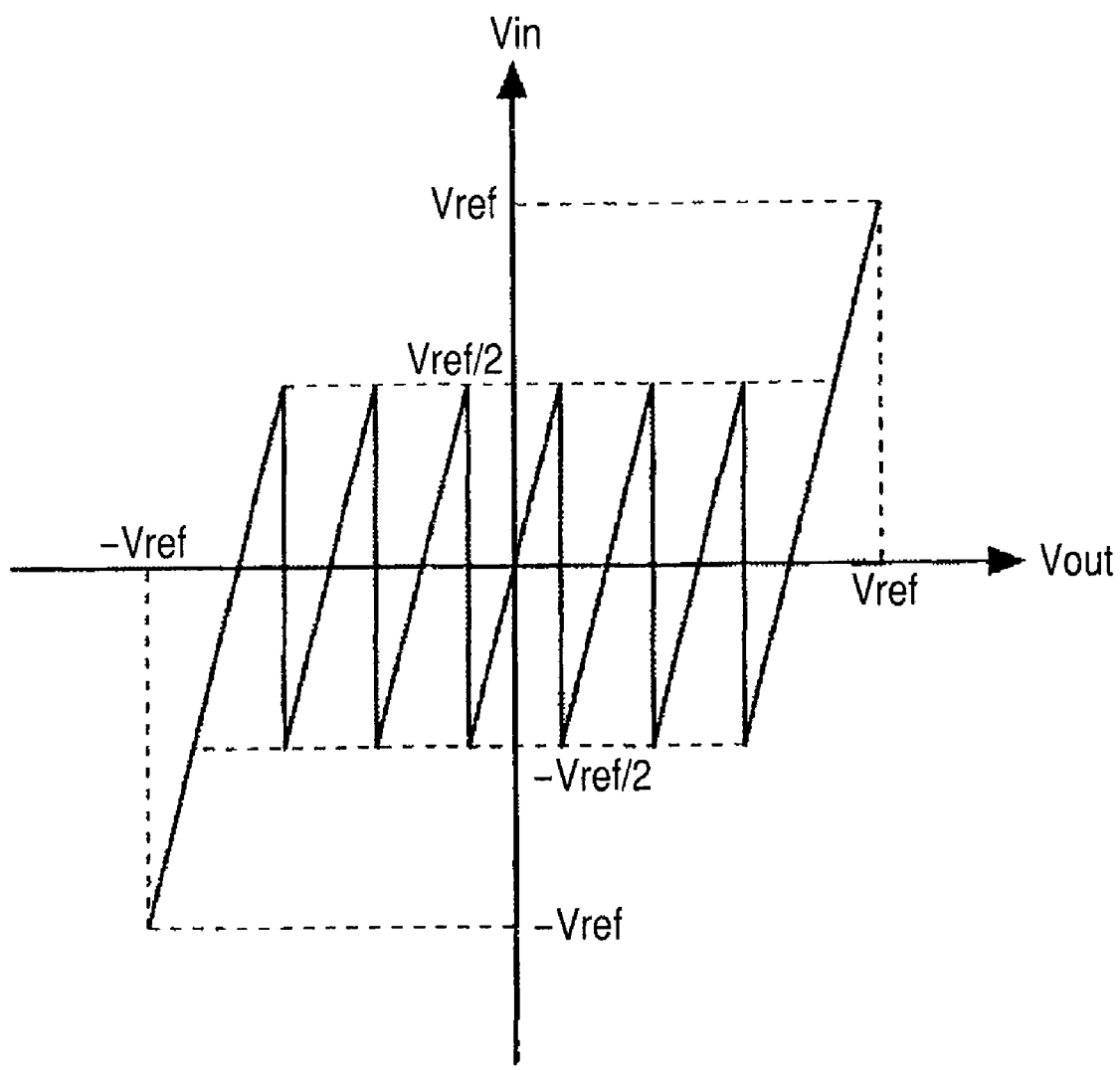
FIG. 3 is a diagram showing a transfer function being a premise of the pipeline type A/D converter according to the first embodiment of the present invention.

In the pipeline type A/D converter that performs the above operations, the relationship of the input and output can be represented as a transfer function shown in FIG. 3. In the transfer function shown in FIG. 3, the horizontal axis thereof indicates the level of a signal inputted to the pipeline type A/D converter, and the vertical axis thereof indicates the level of a signal outputted from the pipeline type A/D converter.

Figure 4:
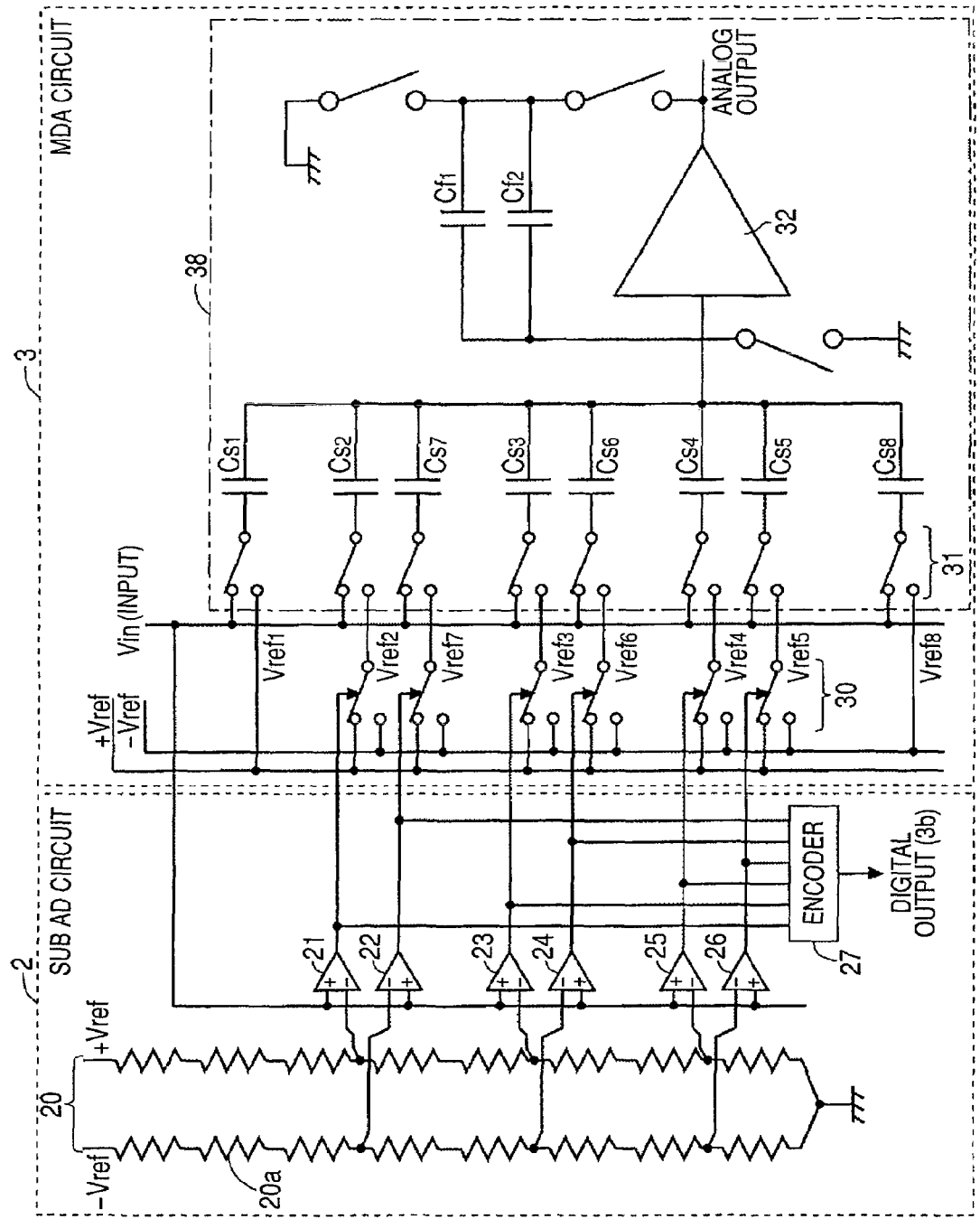
FIG. 4 is a circuit diagram of the stage being the premise of the pipeline type A/D converter according to the first embodiment of the present invention.

Described concretely, the transfer function shown in FIG. 3 is of a transfer function of the pipeline type A/D converter being a premise of the present embodiment. A stage configuration of the pipeline type A/D converter is shown in FIG. 4. The sub AD circuit 2 shown in FIG. 4 is equipped with a reference voltage generator 20, comparators 21 through 26 and an encoder 27. The reference voltage generator 20 includes sixteen resistive elements 20a coupled in series and divides reference voltages $+V_{ref}$ and $-V_{ref}$ to generate voltages to be supplied to the comparators 21 through 26. Incidentally, the resistance values of the sixteen resistive elements 20a are assumed to be all equal to one another.

The comparators 21 through 26 respectively compare the voltages divided by the reference voltage generator 20 and an input signal $V_{in}$ and output the results of comparison to the encoder 27 and the MDA circuit 3. The encoder 27 generates a 3-bit digital signal, based on the results outputted from the comparators 21 through 26 and outputs the same to the error correction circuit 1.

The MDA circuit 3 shown in FIG. 4 includes switches 30 and 31, capacitors Cs1 through Cs8, an amplifier 32 and feedback capacitors Cf1 and Cf2. The switches 30 are respectively controlled based on the results outputted from the comparators 21 through 26 and switched to either of the reference voltages $+V_{ref}$ and $-V_{ref}$. The switches 31 respectively perform switching between the input signal $V_{in}$ and reference voltages $V_{ref1}$ through $V_{ref8}$ outputted from the switches 30.

The pipeline type A/D converter having the multi-bit stage corresponding to N bits such as shown in FIG. 4 has a stage gain of $2^{N-1}$ times and $2^N-2$ returns as in the transfer function shown in FIG. 3. Incidentally, in FIGS. 3 and 4, N=3, the stage gain is 4 times and the number of returns is 6.

Figure 5:
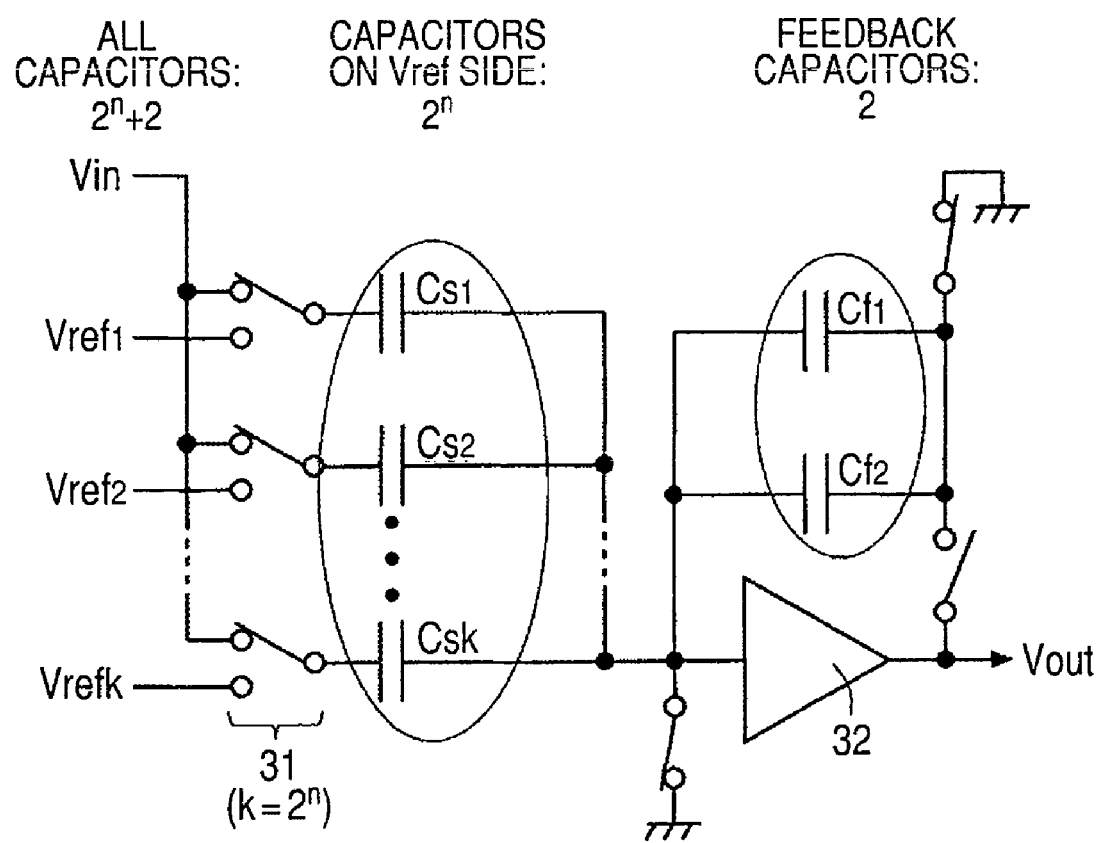
FIG. 5 is a circuit diagram of an MDA circuit being a premise of the pipeline A/D converter according to the first embodiment of the present invention.

The multi-bit stage of 3 bits shown in FIG. 4 is called charge transmission type. A circuit diagram related to an MDA circuit 3 of an N-bit-based multi-bit stage corresponding to the charge transmission type is shown in FIG. 5. The MDA circuit 3 shown in FIG. 5 stores electrical charges each corresponding to signal amplitude in $2^N$ capacitors Cs1 through Csk (where k=$2^N$) provided on the input side of an amplifier 32, using switches 31. Owing to the operations of the $2^N$-2 comparators lying within such a sub AD circuit 2 as shown in FIG. 4, the reference voltages +$V_{ref}$ and −$V_{ref}$ each corresponding to the input signal $V_{in}$ are thereafter coupled so that the potentials on the input sides of the capacitors Cs1 through Csk change. Incidentally, while $2^N$-2 capacitors respectively coupled to the comparators, of the capacitors Cs1 through Csk change in the coupled reference voltages due to the results of comparison by the comparators, the remaining two capacitors are respectively coupled to a predetermined reference voltage.

The electrical charges of the capacitors Cs1 through Csk are transferred to the two feedback capacitors Cf1 and Cf2 coupled to the input/output of the amplifier 32. Thus, a potential obtained by multiplying the input signal $V_{in}$ by $2^{N-1}$ and a potential corresponding to the combined sum of the reference potentials to which the capacitors Cs1 through Csk are coupled are generated as an output signal $V_{out}$ of the amplifier 32. Described concretely, $V_{out}=2^{N-1} \cdot V_{in} - m \cdot V_{ref}/2$. Incidentally, m indicates a value obtained by subtracting the number of the switches 31 coupled to the reference voltage −$V_{ref}$ from the number of the switches 31 coupled to the reference voltage +$V_{ref}$.

Figure 6:
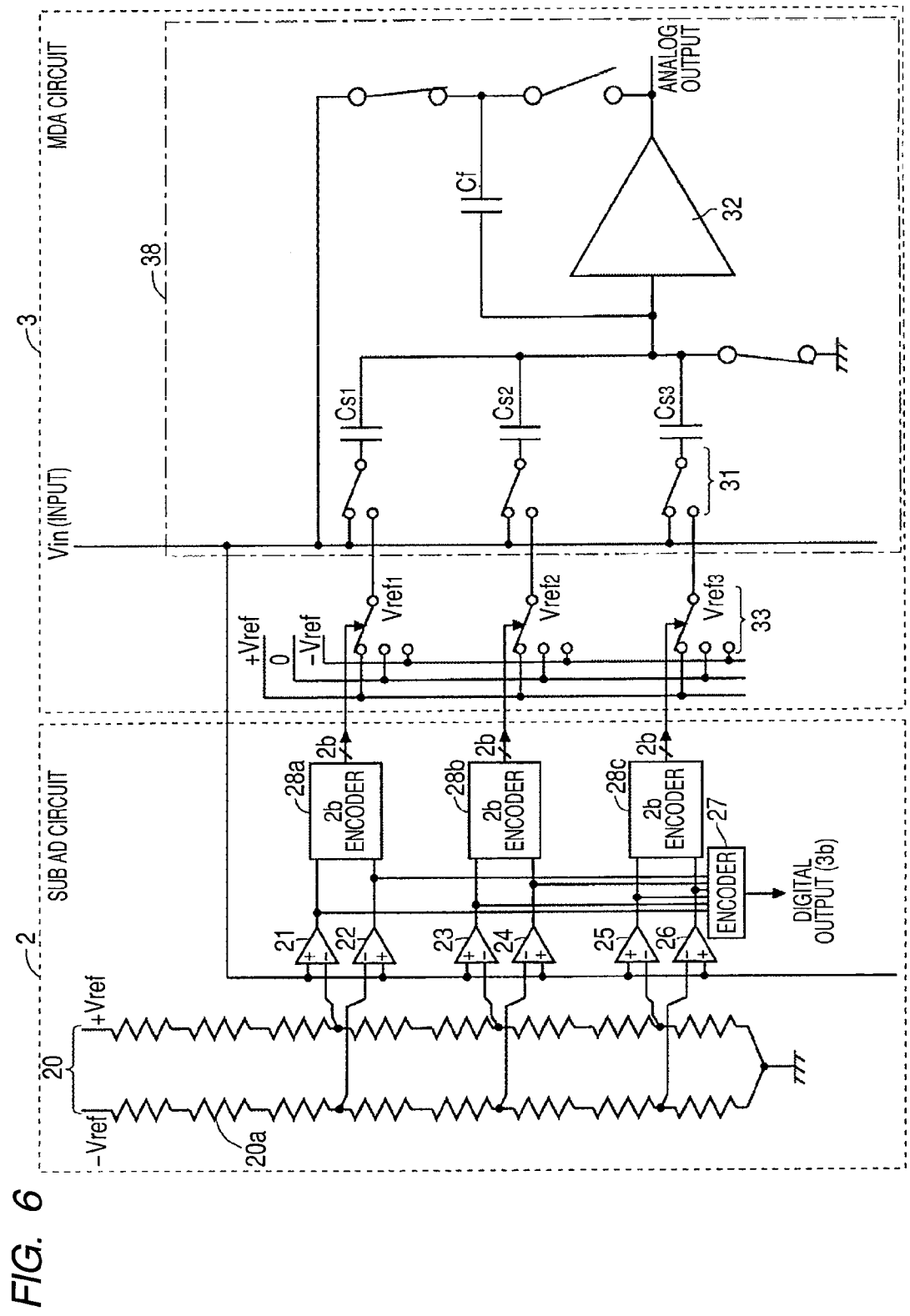
FIG. 6 is a circuit diagram of another stage being a premise of the pipeline type A/D converter according to the first embodiment of the present invention.

On the other hand, a flip around type multi-bit stage is known as one other than the multi-bit stage of 3 bits shown in FIG. 4. A sub AD circuit 2 shown in FIG. 6 is equipped with a reference voltage generator 20, comparators 21 through 26 and an encoder 27 in a manner similar to FIG. 4 and includes 2-bit encoders 28a, 28b and 28c each provided corresponding to the two comparators of the comparators 21 through 26. Further, an MDA circuit 3 shown in FIG. 6 is equipped with switches 33 controlled based on the results outputted from the 2-bit encoders 28a, 28b and 28c in place of the switches 30 and includes switches 31, capacitors Cs1 through Cs3, an amplifier 32 and a feedback capacitor Cf.

Figure 7:
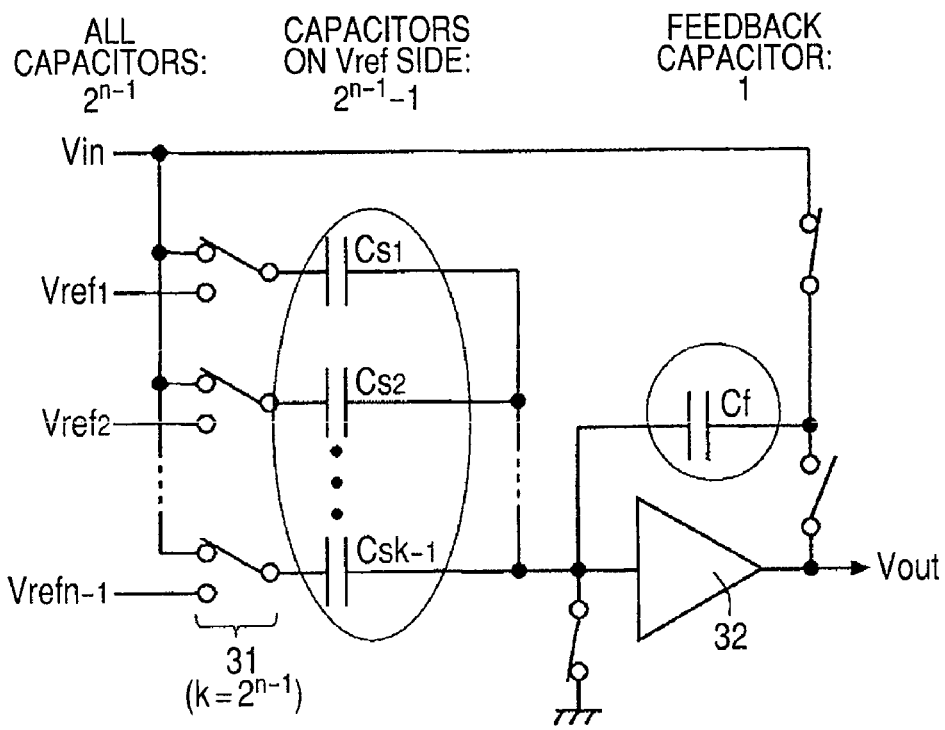
FIG. 7 is a circuit diagram of another MDA circuit being a premise of the pipeline type A/D converter according to the first embodiment of the present invention.

A circuit diagram related to an MDA circuit 3 of an N-bit-based multi-bit stage corresponding to the flip around type is shown in FIG. 7. The MDA circuit 3 shown in FIG. 7 stores electrical charges each corresponding to signal amplitude in $2^{N-1}$ capacitors Cs1 through Csk-1 and Cf (where k=$2^{N-1}$) provided on the input side of an amplifier 32, using switches 31. Of these, one capacitor Cf functions as a feedback capacitor by being coupled to the input/output of the amplifier 32. The remaining capacitors Cs1 through Csk−1 are respectively coupled with reference voltages +$V_{ref}$ and −$V_{ref}$ each corresponding to an input signal $V_{in}$ owing to the operations of the $2^N$−2 comparators and 2-bit encoder lying within the sub AD circuit 2, so that the potentials on the input sides of the capacitors Cs1 through Csk−1 change.

The electrical charges of the capacitors Cs1 through Csk−1 are transferred to the feedback capacitor Cf coupled to the input/output of the amplifier 32. Thus, a potential obtained by multiplying the input signal $V_{in}$ by $2^{N-1}$ and a potential corresponding to the combined sum of reference potentials to which the capacitors Cs1 through Csk are coupled, are generated as an output signal $V_{out}$ of the amplifier 32. Described specifically, $V_{out}=2^{N-1} \cdot V_{in} - m \cdot V_{ref}$. Incidentally, m indicates a value obtained by subtracting the number of the switches 31 coupled to the reference voltage −$V_{ref}$ from the number of the switches 31 coupled to the reference voltage +$V_{ref}$.

As described above, the pipeline type A/D converter being the premise of the present embodiment needs to multiply the stage gain by $2^{N-1}$ in order to make the input amplitude and the output amplitude identical to each other. It is also necessary to reduce a feedback factor of the amplifier 32 by an increase in signal and enhance a unity gain frequency at the output node of the amplifier 32. A high frequency characteristic or response is further required. Therefore, combined with the effect of the parasitic capacitance of the input part of the amplifier 32, the pipeline type A/D converter being the premise of the present embodiment causes an increase in current consumption of the amplifier 32 and has inhibited the realization of low power consumption.

Here, the feedback factor is expressed in the following equation (1) and is affected by the parasitic capacitance $C_{para}$ of the input part of the amplifier 32. Therefore, when the frequency characteristic or response of the amplifier 32 is enhanced, a device size increases simultaneously with it and the parasitic capacitance $C_{para}$ also increases. When the feedback capacitance Cf becomes small as is understood from the equation (1), the influence of the parasitic capacitance $C_{para}$ becomes large, thus resulting in a reduction in feedback factor.

$$\text{feedback factor } \beta = \begin{cases} \dfrac{Cfb}{Csamp+Cfb+Cpara} = \dfrac{1}{2^{N-1}+\dfrac{Cpara}{Cfb}+1} & \begin{pmatrix}\text{charge}\\\text{transmission}\\\text{type}\end{pmatrix} \\ \dfrac{Cfb}{Csamp+Cpara} = \dfrac{1}{2^{N-1}+\dfrac{Cpara}{Cfb}} & \begin{pmatrix}\text{flip around}\\\text{type}\end{pmatrix} \end{cases} \quad (1)$$

Figure 8:
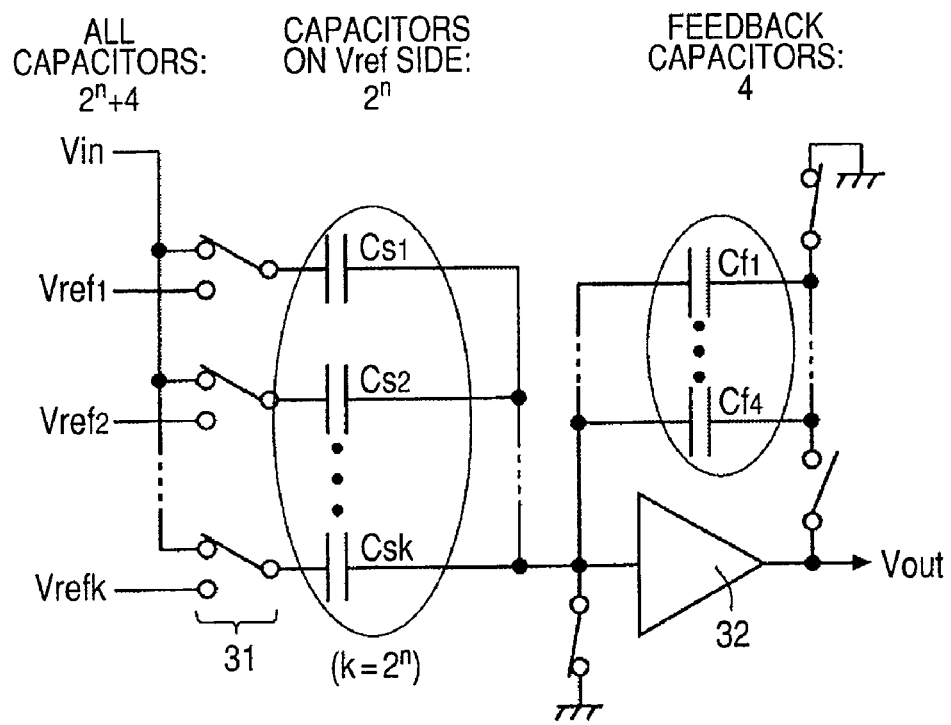
FIG. 8 is a circuit diagram of an MDA circuit of the pipeline type A/D converter according to the first embodiment of the present invention.

With the foregoing in view, a circuit diagram of an MDA circuit 3 employed in the pipeline type A/D converter of the charge transmission type according to the present embodiment is shown in FIG. 8. The circuit diagram shown in FIG. 8 corresponds to a part 38 surrounded by a broken line in the stage shown in FIG. 4, and other parts are identical in configuration to those shown in FIGS. 1 and 4. Their detailed explanations will therefore be omitted.

The MDA circuit 3 shown in FIG. 8 includes $2^N$ capacitors Cs1 through Csk (where k=$2^N$) provided on the input side of an amplifier 32, switches 31 which respectively perform switching between an input signal $V_{in}$ and reference voltages $V_{ref1}$ through $V_{refk}$, the amplifier 32 and four feedback capacitors Cf1 through Cf4 provided at the input/output of the amplifier 32.

The MDA circuit 3 shown in FIG. 8 stores electrical charges each corresponding to signal amplitude in the $2^N$ capacitors Cs1 through Csk (where k=$2^N$) provided on the input side of the amplifier 32, using the switches 31. Thereafter, owing to the operations of the $2^N$-2 comparators lying within such a sub AD circuit 2 as shown in FIG. 4, reference voltages +$V_{ref}$ and −$V_{ref}$ each corresponding to the input signal $V_{in}$ are coupled so that the potentials on the input sides of the capacitors Cs1 through Csk change. Incidentally, while the $2^N$-2 capacitors respectively coupled to the comparators, of the capacitors Cs1 through Csk change in the coupled reference voltages according to the results of comparison by the comparators, the remaining two capacitors are respectively coupled to a predetermined reference voltage.

The electrical charges of the capacitors Cs1 through Csk are transferred to the four feedback capacitors Cf1 through Cf4 coupled to the input/output of the amplifier 32. Thus, a potential obtained by multiplying the input signal $V_{in}$ by $2^{N-2}$ and a potential corresponding to the combined sum of the reference potentials to which the capacitors Cs1 through Csk are coupled are generated as an output signal $V_{out}$ of the amplifier 32. Described concretely, $V_{out}=2^{N-2}\cdot V_{in}-m\cdot V_{ref}/2$. Incidentally, m indicates a value obtained by subtracting the number of the switches 31 coupled to the reference voltage $-V_{ref}$ from the number of the switches 31 coupled to the reference voltage $+V_{ref}$.

Figure 9:
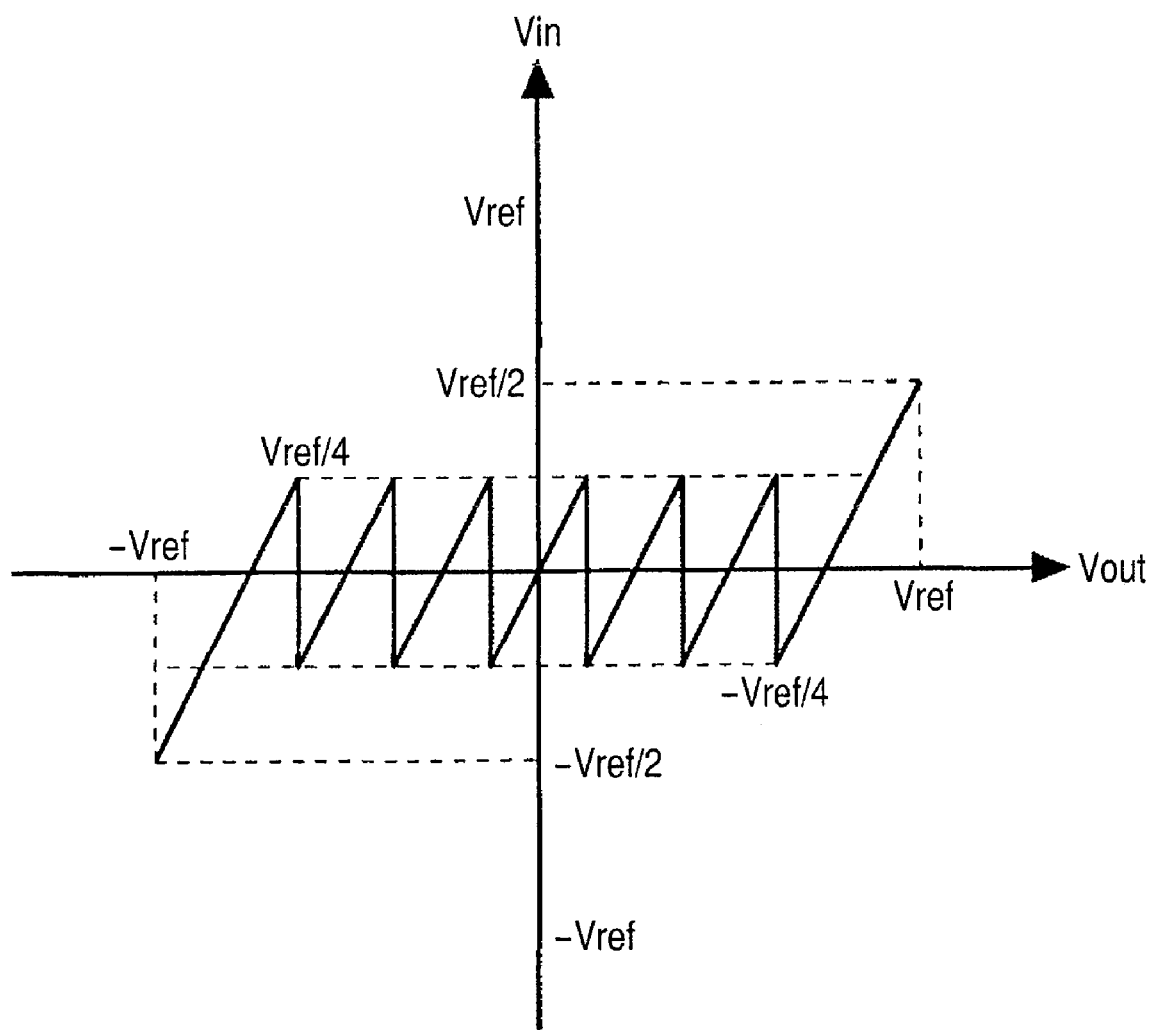
FIG. 9 is a diagram showing a transfer function of the pipeline type A/D converter according to the first embodiment of the present invention.

Incidentally, a transfer function based on the MDA circuit 3 shown in FIG. 8 becomes a function shown in FIG. 9. The transfer function shown in FIG. 9 is of a transfer function where N=3 in a manner similar to the transfer function shown in FIG. 3. The transfer function shown in FIG. 9 reduces or relaxes the stage gain to ½ while the number of returns is kept as being the same six times as the transfer function shown in FIG. 3. That is, in the pipeline type A/D converter according to the present embodiment, the stage gain is reduced from $2^{N-1}$ to $2^{N-2}$ while the number of returns is being kept as being $2^{N}-2$. Therefore, the feedback factor of the amplifier 32 can be prevented from being made lower than the equation (1) as expressed in the following equation (2), thus making it possible to reduce current consumption.

$$\text{feedback factor } \beta = \frac{1}{2^{N-2}+\frac{Cpara}{Cfb}+1} = \frac{1}{2^{N-2}\left[1+\frac{Cpara}{Csamp}\right]+1} \quad (2)$$

Figure 10:
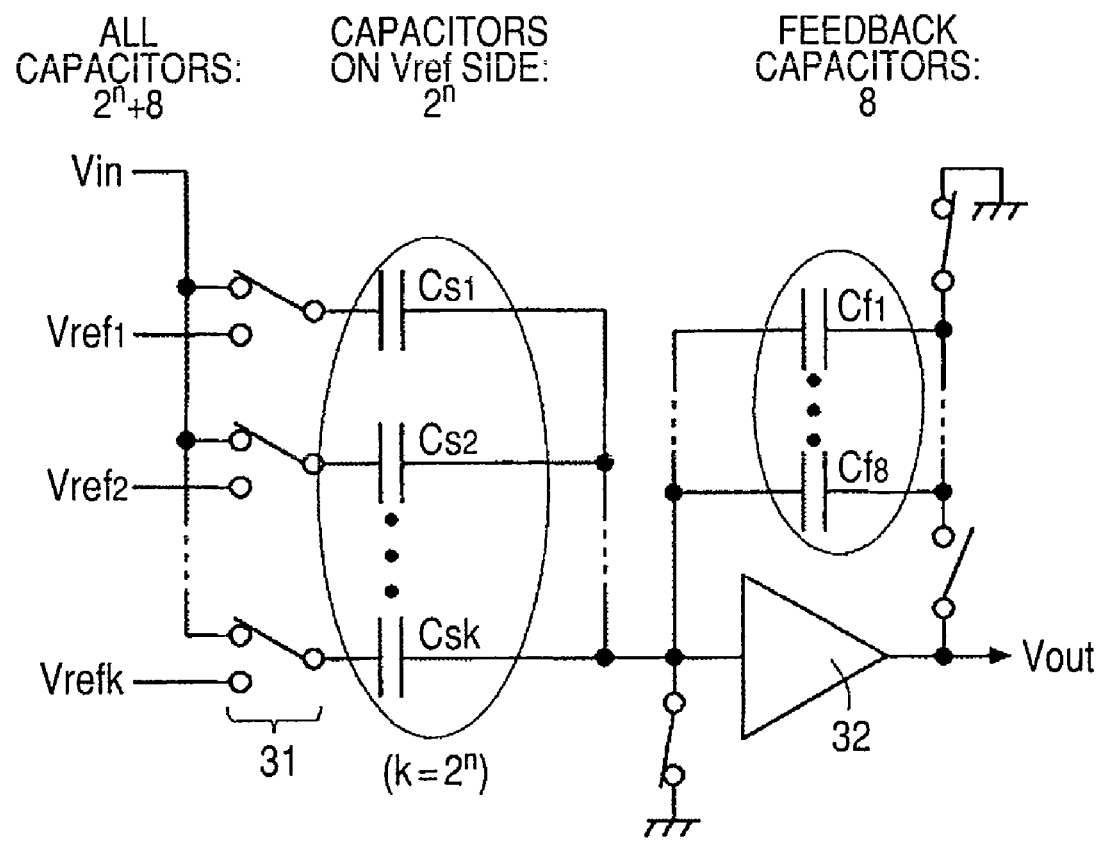
FIG. 10 is a circuit diagram of another MDA circuit of the pipeline type A/D converter according to the first embodiment of the present invention.

A circuit diagram of an MDA circuit 3 employed in a pipeline type A/D converter of another charge transmission type according to the present embodiment is shown in FIG. 10. The circuit diagram shown in FIG. 10 corresponds to the part 38 surrounded by the broken line in the stage shown in FIG. 4, and other parts are identical in configuration to those shown in FIGS. 1 and 4. Their detailed explanations will therefore be omitted.

The MDA circuit 3 shown in FIG. 10 includes $2^N$ capacitors Cs1 through Csk (where k=$2^N$) provided on the input side of an amplifier 32, switches 31 which respectively perform switching between an input signal $V_{in}$ and reference voltages $V_{ref1}$ through $V_{refk}$, the amplifier 32 and eight feedback capacitors Cf1 through Cf8 provided at the input/output of the amplifier 32.

The MDA circuit 3 shown in FIG. 10 stores electrical charges each corresponding to signal amplitude in the $2^N$ capacitors Cs1 through Csk (where k=$2^N$) provided on the input side of the amplifier 32, using the switches 31. Thereafter, owing to the operations of the $2^N-2$ comparators lying within such a sub AD circuit 2 as shown in FIG. 4, reference voltages $+V_{ref}$ and $-V_{ref}$ each corresponding to the input signal $V_{in}$ are coupled so that the potentials on the input sides of the capacitors Cs1 through Csk change. Incidentally, while the $2^N-2$ capacitors respectively coupled to the comparators, of the capacitors Cs1 through Csk change in the coupled reference voltages according to the results of comparison by the comparators, the remaining two capacitors are respectively coupled to a predetermined reference voltage.

The electrical charges of the capacitors Cs1 through Csk are transferred to the eight feedback capacitors Cf1 through Cf8 coupled to the input/output of the amplifier 32. Thus, a potential obtained by multiplying the input signal $V_{in}$ by $2^{N-3}$ and a potential corresponding to the combined sum of the reference potentials to which the capacitors Cs1 through Csk are coupled are generated as an output signal $V_{out}$ of the amplifier 32. Described concretely, $V_{out}=2^{N-3}\cdot V_{in}-m\cdot V_{ref}/2$. Incidentally, m indicates a value obtained by subtracting the number of the switches 31 coupled to the reference voltage $-V_{ref}$ from the number of the switches 31 coupled to the reference voltage $+V_{ref}$.

Figure 11:
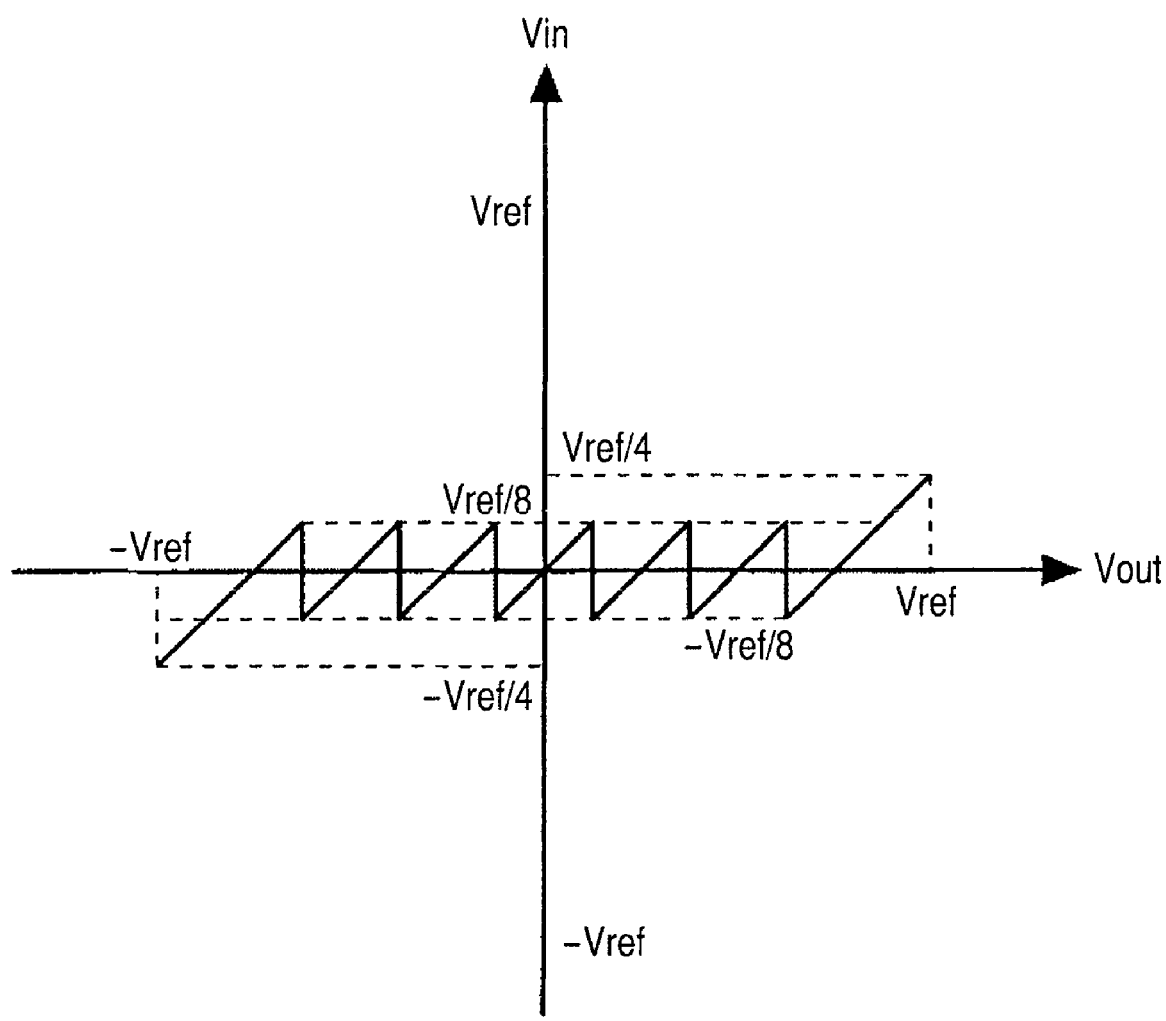
FIG. 11 is a diagram showing another transfer function of the pipeline type A/D converter according to the first embodiment of the present invention.

Incidentally, a transfer function based on the MDA circuit 3 shown in FIG. 10 becomes a function shown in FIG. 11. The transfer function shown in FIG. 11 is of a transfer function where N=3 in a manner similar to the transfer function shown in FIG. 3. The transfer function shown in FIG. 11 reduces or relaxes the stage gain to ¼ while the number of returns is kept as being the same six times as the transfer function shown in FIG. 3. That is, in the pipeline type A/D converter according to the present embodiment, the stage gain is reduced from $2^{N-1}$ to $2^{N-3}$ while the number of returns is kept as being $2^{N}-2$. It is therefore possible to prevent the feedback factor of the amplifier 32 from being made lower than the equation (1) as expressed in the following equation (3), thus making it possible to reduce current consumption.

$$\text{feedback factor } \beta = \frac{1}{2^{N-3}+\frac{Cpara}{Cfb}+1} = \frac{1}{2^{N-3}\left[1+\frac{Cpara}{Csamp}\right]+1} \quad (3)$$

Assume now that the configuration of the pipeline type A/D converter according to the present embodiment is more generalized based on the MDA circuits 3 shown in FIGS. 8 and 10. In doing so, the MDA circuit 3 can set the stage gain of the transfer function to $2^{N-K-1}$ while keeping the number of returns as being $2^N-2$ by providing $2^N$ capacitors and $2^{K+1}$ feedback capacitors. Incidentally, K is an integer having a relation of $1 \leq K \leq N$. Incidentally, the MDA circuit 3 shown in FIG. 8 corresponds to K=1, whereas the MDA circuit 3 shown in FIG. 10 corresponds to K=2.

Second Embodiment

Figure 12:
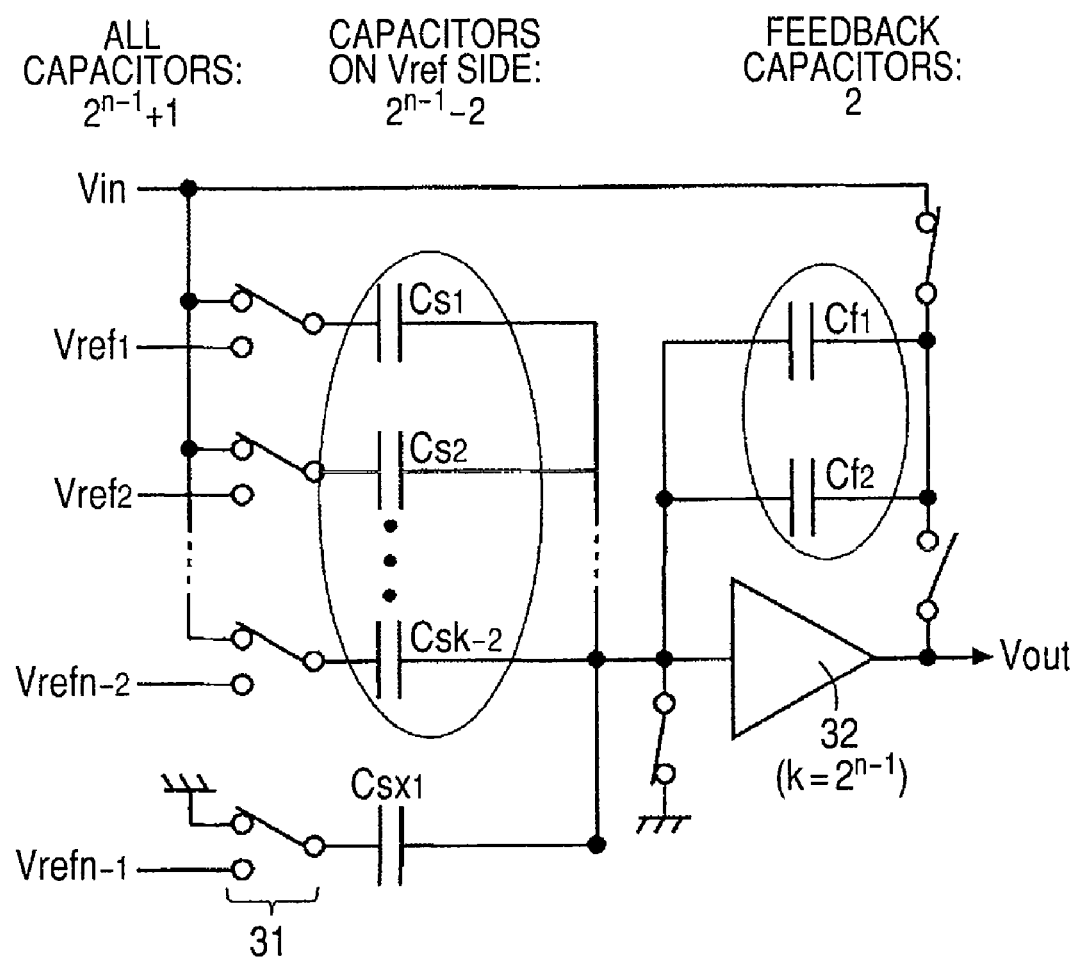
FIG. 12 is a circuit diagram of an MDA circuit of a pipeline type A/D converter according to a second embodiment of the present invention.

A circuit diagram of an MDA circuit 3 employed in a pipeline type A/D converter of a flip around type according to the present embodiment is shown in FIG. 12. The circuit diagram shown in FIG. 12 corresponds to the part 38 surrounded by the broken line in the stage shown in FIG. 6, and other parts are identical in configuration to those shown in FIGS. 1 and 6. Their detailed explanations will therefore be omitted.

The MDA circuit 3 shown in FIG. 12 includes $2^{N-1}$ capacitors Cs1 through Csk−2 (where k=$2^{N-1}$) provided on the input side of an amplifier 32, capacitors Cf1 and Cf2, switches 31 which respectively perform switching between an input signal $V_{in}$ and reference voltages $V_{ref1}$ through $V_{refn-1}$, the amplifier 32 and a capacitor Cx1. Incidentally, the capacitors Cf1 and Cf2 respectively function as feedback capacitors provided at the input/output of the amplifier 32. The capacitor Cx1 has been charged to 0V.

The MDA circuit 3 shown in FIG. 12 stores electrical charges each corresponding to signal amplitude in the $2^{N-1}$ capacitors Cs1 through Csk−2 (where k=$2^{N-1}$) and Cf1 and Cf2 provided on the input side of the amplifier 32, using the switches 31. Thereafter, owing to the operations of the $2^N-2$ comparators and 2-bit encoder lying within such a sub AD circuit 2 as shown in FIG. 6, reference voltages $+V_{ref}$ and $-V_{ref}$ each corresponding to the input signal $V_{in}$ are coupled so that the potentials on the input sides of the capacitors Cs1 through Csk−2 and Cx1 change.

The electrical charges of the capacitors Cs1 through Csk−2 are transferred to the two feedback capacitors Cf1 and Cf2 coupled to the input/output of the amplifier 32. Thus, a potential obtained by multiplying the input signal $V_{in}$ by $2^{N-2}$ and a potential corresponding to the combined sum of the reference potentials to which the capacitors Cs1 through Csk−2 and Cx1 are coupled are generated as an output signal $V_{out}$ of the amplifier 32. Described concretely, $V_{out}=2^{N-2} \cdot V_{in} - m \cdot V_{ref}$. Incidentally, m indicates a value obtained by subtracting the number of the switches 31 coupled to the reference voltage $-V_{ref}$ from the number of the switches 31 coupled to the reference voltage $+V_{ref}$.

Since a feedback factor of the MDA circuit 3 shown in FIG. 12 is expressed in the following equation (4) and becomes higher than that expressed in the equation (1), current consumption can be reduced.

$$\text{feedback factor } \beta = \frac{1}{2^{N-2} + \frac{Cpara}{Cfb} + \frac{1}{2}} = \frac{1}{2^{N-2}\left[1 + \frac{Cpara}{Csamp}\right] + \frac{1}{2}} \quad (4)$$

Figure 13:
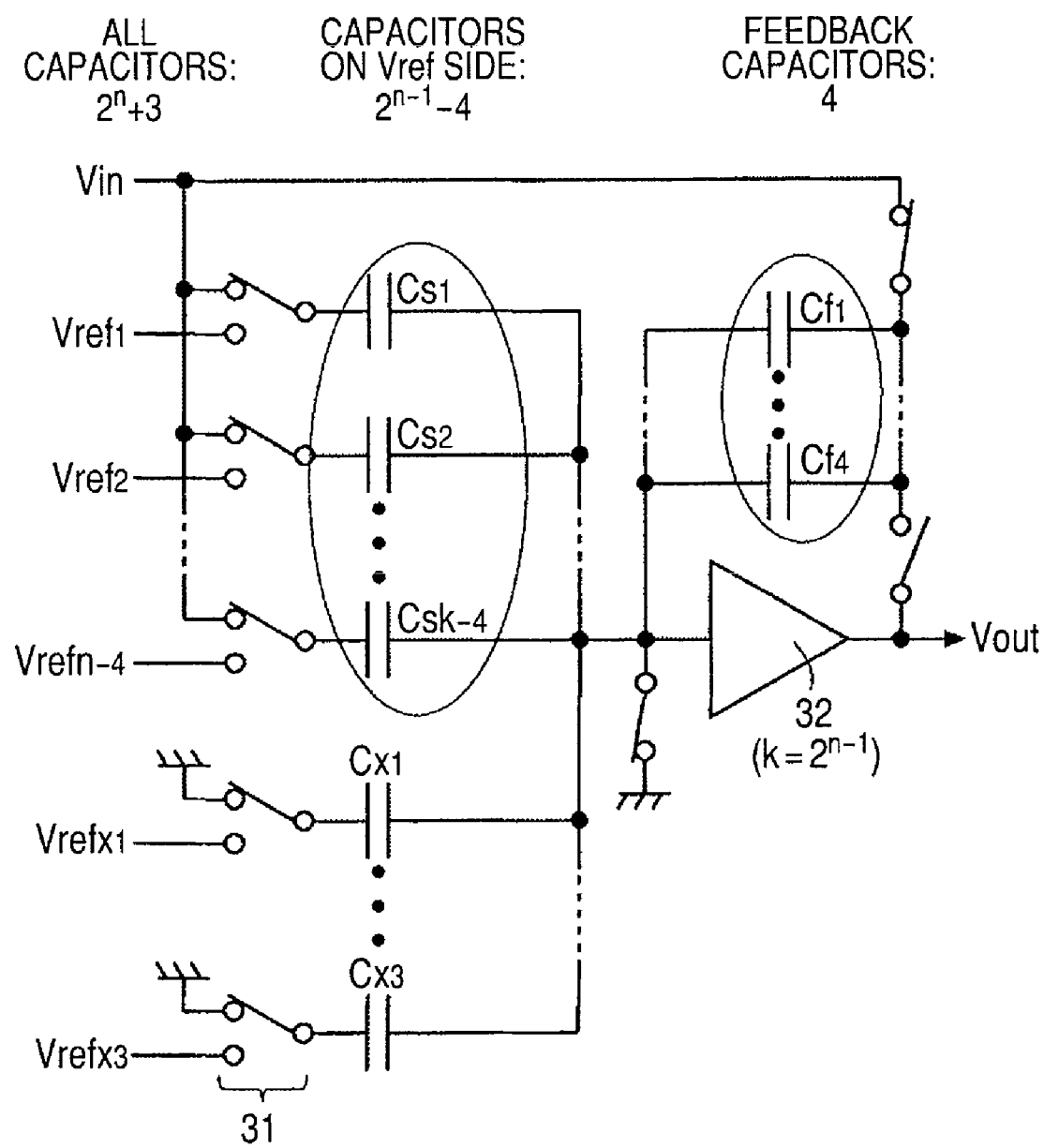
FIG. 13 is a circuit diagram of another MDA circuit of the pipeline type A/D converter according to the second embodiment of the present invention.

Next, a circuit diagram of an MDA circuit 3 employed in a pipeline type A/D converter of another flip around type according to the present embodiment is shown in FIG. 13. The circuit diagram shown in FIG. 13 corresponds to the part 38 surrounded by the broken line in the stage shown in FIG. 6, and other parts are identical in configuration to those shown in FIGS. 1 and 6. Their detailed explanations will therefore be omitted.

The MDA circuit 3 shown in FIG. 13 includes $2^{N-1}$ capacitors Cs1 through Csk−4 (where $k=2^{N-1}$) provided on the input side of an amplifier 32, capacitors Cf1 through Cf4, switches 31 which respectively perform switching between an input signal $V_{in}$ and reference voltages $V_{refl}$ through $V_{refn-4}$ and $V_{refx1}$ through $V_{refx3}$, the amplifier 32 and capacitors Cx1 through Cx3. Incidentally, the capacitors Cf1 through Cf4 respectively function as feedback capacitors provided at the input/output of the amplifier 32. The capacitors Cx1 through Cx3 have been charged to 0V.

The MDA circuit 3 shown in FIG. 13 stores electrical charges each corresponding to signal amplitude in the $2^{N-1}$ capacitors Cs1 through Csk−4 (where $k=2^{N-1}$) and Cf1 through Cf4 provided on the input side of the amplifier 32, using the switches 31. Thereafter, owing to the operations of the $2^N-2$ comparators and 2-bit encoder lying within such a sub AD circuit 2 as shown in FIG. 6, reference voltages $+V_{ref}$ and $-V_{ref}$ each corresponding to the input signal $V_{in}$ are coupled so that the potentials on the input sides of the capacitors Cs1 through Csk−4 and Cx1 through Cx3 change.

The electrical charges of the capacitors Cs1 through Csk−4 are transferred to the four feedback capacitors Cf1 through Cf4 coupled to the input/output of the amplifier 32. Thus, a potential obtained by multiplying the input signal $V_{in}$ by $2^{N-3}$ and a potential corresponding to the combined sum of the reference potentials to which the capacitors Cs1 through Csk−4 and Cx1 through Cx3 are coupled are generated as an output signal $V_{out}$ of the amplifier 32. Described concretely, $V_{out}=2^{N-3} \cdot V_{in} - m \cdot V_{ref}$. Incidentally, m indicates a value obtained by subtracting the number of the switches 31 coupled to the reference voltage $-V_{ref}$ from the number of the switches 31 coupled to the reference voltage $+V_{ref}$.

Since a feedback factor of the MDA circuit 3 shown in FIG. 13 is expressed in the following equation (5) and becomes higher than that expressed in the equation (1), current consumption can be reduced.

$$\text{feedback factor } \beta = \frac{1}{2^{N-3} + \frac{Cpara}{Cfb} + \frac{3}{4}} = \frac{1}{2^{N-3}\left[1 + \frac{Cpara}{Csamp}\right] + \frac{3}{4}} \quad (5)$$

Assume now that the configuration of the pipeline type A/D converter according to the present embodiment is more generalized based on the MDA circuits 3 shown in FIGS. 12 and 13. In doing so, the MDA circuit 3 can set the stage gain of a transfer function to $2^{N-K-1}$ while maintaining the number of returns at $2^N-2$ by coupling the $2^K$ capacitors of the $2^{N-1}$ capacitors to the input/output of the amplifier 32 and allowing them as the feedback capacitors. Incidentally, K is an integer having a relation of $1 \leq K \leq N$. Incidentally, the MDA circuit 3 shown in FIG. 12 corresponds to K=1, whereas the MDA circuit 3 shown in FIG. 13 corresponds to K=2.

Third Embodiment

Figure 14:
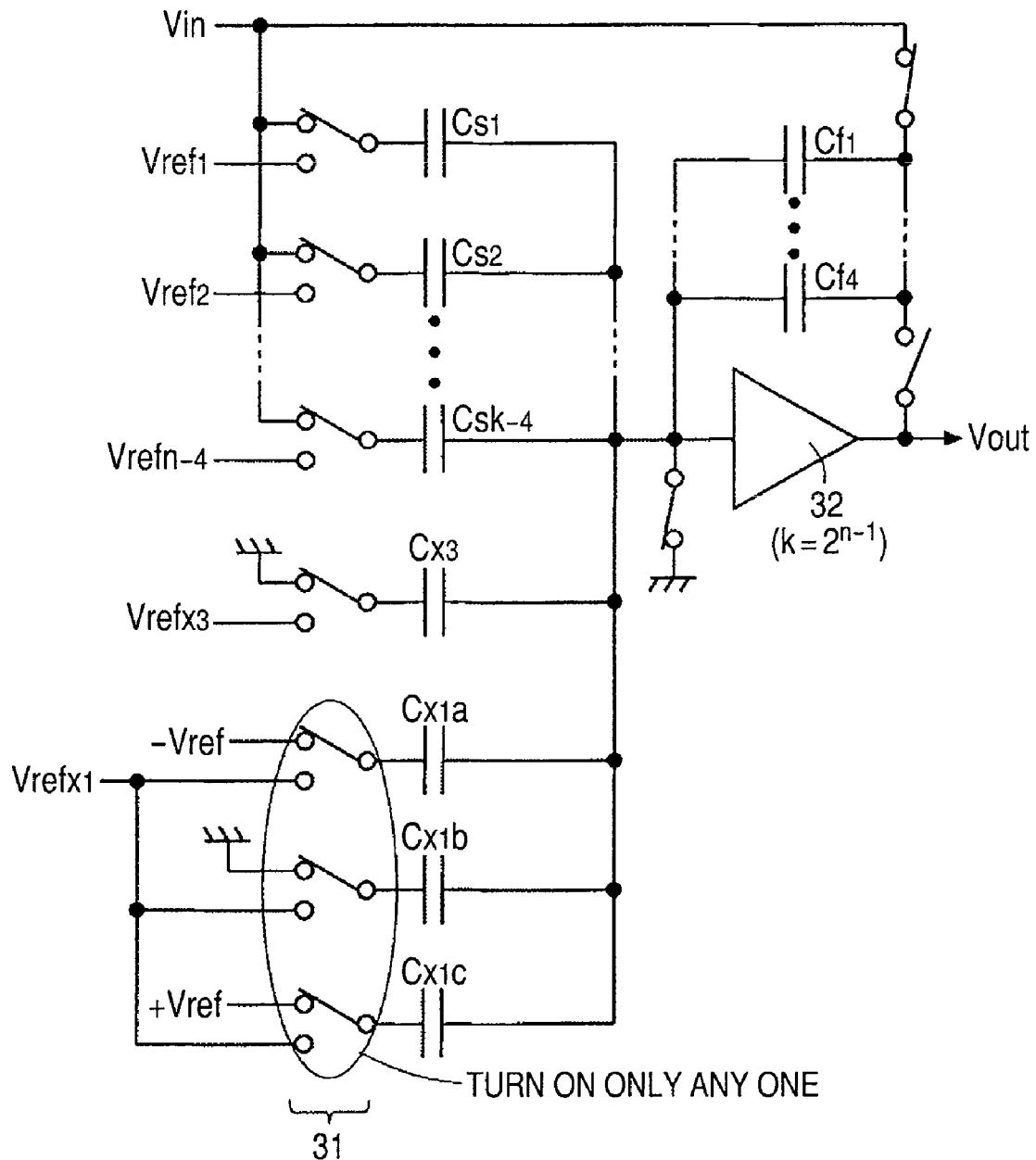
FIG. 14 is a circuit diagram of an MDA circuit of a pipeline type A/D converter according to a third embodiment of the present invention.

A pipeline type A/D converter according to the present embodiment is of the pipeline type A/D converter of the flip around type shown in the second embodiment except that the MDA circuit 3 shown in FIG. 13 is changed to an MDA circuit 3 shown in FIG. 14. The description of those other than the MDA circuit 3 shown in FIG. 14 in the pipeline type A/D converter according to the present embodiment will therefore be omitted.

In the MDA circuit 3 shown in FIG. 13 illustrative of the second embodiment, the three capacitors Cx1 through Cx3 each charged to 0V have been coupled. Therefore, since the capacitors coupled to the input node of the amplifier 32 increase in number as compared with the MDA circuit 3 shown in FIG. 5, an increase in feedback factor has been suppressed. Thus, in order to achieve a further increase in feedback factor in the MDA circuit 3 shown in FIG. 14 of the present embodiment, capacitors Cx1a through Cx1c are provided in place of the capacitor Cx1 and the Cx2 is omitted. Incidentally, the capacitor Cx1a is charged to a reference voltage $-V_{ref}$, the capacitor Cx1b is charged to 0V and the capacitor Cx1c is charged to a reference voltage $+V_{ref}$, respectively.

The operation of the MDA circuit 3 shown in FIG. 14 will be explained concretely. Firstly, the three capacitors Cx1 through Cx3 are provided as the capacitors uncoupled to the input signal $V_{in}$ in the MDA circuit 3 shown in FIG. 13. These capacitors Cx1 through Cx3 are coupled to GND upon sampling and their electrical charges are brought to 0. On the other hand, the capacitors Cx1 through Cx3 are coupled to their corresponding reference voltages $V_{refx1}$ through $V_{refx3}$ upon hold, so that the transfer of the electrical charges is urged to carry out a predetermined arithmetic operation.

The operations of the capacitors Cx1 through Cx3 will be explained in further detail. FIG. 15($a$) is a diagram showing the extracted capacitors Cx1 through Cx3. In FIG. 15($a$), one obtained by multiplying potential changes produced at the input parts of the three capacitors by a capacitance value C prior and subsequent to the switching of the switches 31 (upon change from the sampling to hold) is transferred to the amplifier 32 as a change in electrical charge. Namely, an electrical charge of $-C \cdot (V_{refx1}+V_{refx2}+V_{refx3})$ is outputted to the amplifier 32 in FIG. 15($a$). Incidentally, since the arithmetic operation depends on only the change in the potential, the capacitors are coupled to GND upon hold as shown in FIG. 15(b). Even in the configuration that the capacitors are coupled to their corresponding reference voltages $V_{refx1}$ through $V_{refx3}$ upon sampling, a similar result can be obtained.

Figure 15A:
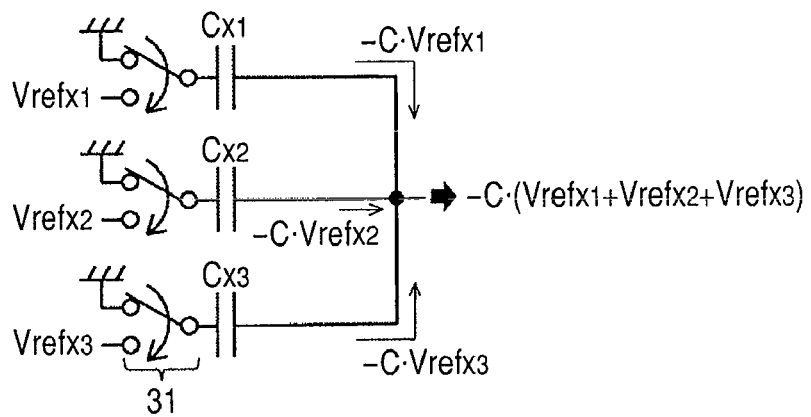
FIG. 15 is diagram for describing a configuration of the MDA circuit of the pipeline type A/D converter according to the third embodiment of the present invention.
Figure 15B:
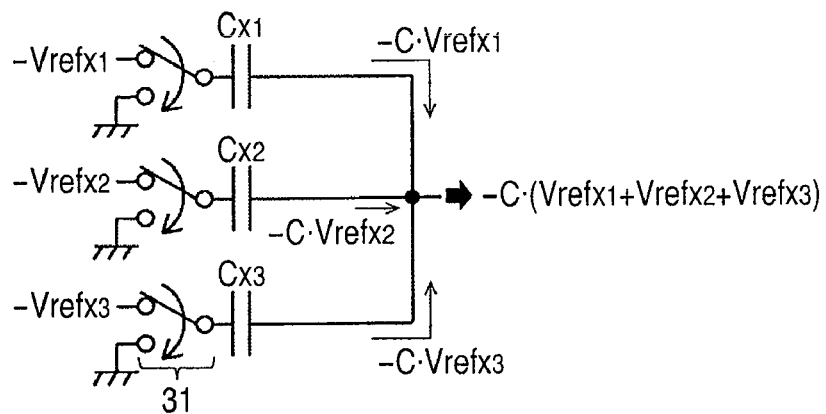
Figure 16A:
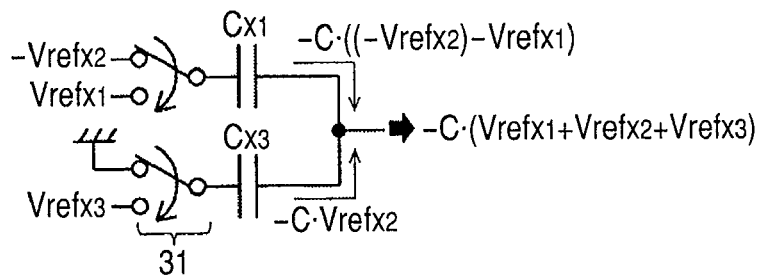
FIG. 16 is a diagram for describing a configuration of the MDA circuit of the pipeline type A/D converter according to the third embodiment of the present invention.

Further, FIGS. 15(a) and 15(b) may be combined to carry out such an arithmetic operation as shown in FIG. 16(a). In FIG. 16(a), there are provided a capacitor Cx1 coupled to a reference voltage $-V_{refx2}$ upon sampling and a reference voltage $V_{refx1}$ upon hold respectively and a capacitor Cx3 coupled to GND upon sampling and a reference voltage $V_{refx3}$ upon hold respectively. Therefore, the number of capacitors coupled to the amplifier 32 can be reduced from three to two in FIG. 16(a). It is therefore possible to reduce the capacitances coupled to the input part of the amplifier 32 and enhance a feedback factor.

It is however necessary to recognize the value of the reference voltage $-V_{refx2}$ upon sampling in the configuration of FIG. 16(a). Since the value of the reference voltage $V_{ref}$ coupled to each capacitor of the sub AD circuit is normally determined from 0 and $\pm V_{ref}$ upon sampling of the MDA circuit 3 in the pipeline type A/D converter, the value of the reference voltage $V_{ref}$ is not known upon sampling.

Figure 16B:
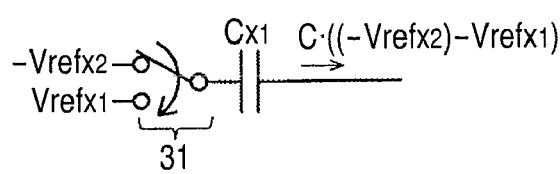
Figure 16C:
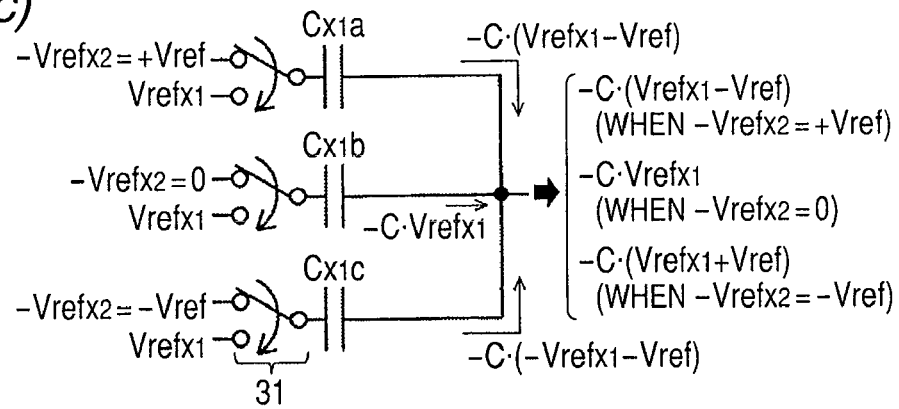

Therefore, the configurations of FIGS. 16(b) and 16(c) can be adopted. FIG. 16(b) is of a circuit in which only the capacitor Cx1 of FIG. 16(a) is extracted, and corresponds to such a configuration that lookahead is performed before the value of the reference voltage $-V_{refx2}$ is decided and electrical charges of 0 and $\pm V_{ref}$ are charged to the capacitor Cx1. In FIG. 16(c), three capacitors Cx1a through Cx1c are prepared and potentials of $+V_{ref}$, 0 and $-V_{ref}$ are respectively charged to the capacitors Cx1a through Cx1c upon sampling. Thereafter, any of the capacitors Cx1a through Cx1c is used when the value of the reference voltage $-V_{refx2}$ is decided. Namely, when the reference voltage $-V_{refx2}$ is $+V_{ref}$ the capacitor Cx1a is used, when the reference voltage $-V_{refx2}$ is 0, the capacitor Cx1b is used, and when the reference voltage $-V_{refx2}$ is $-V_{ref}$ the capacitor Cx1c is used, respectively.

Figure 16D:
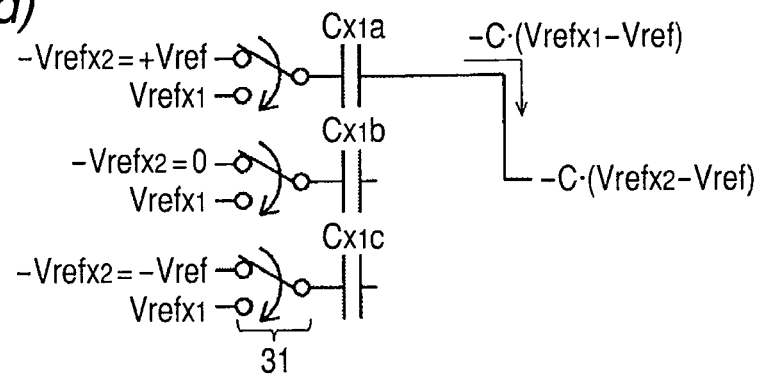

As a concrete operation, any of the switches 31, which is coupled to the capacitor to which the potential corresponding to the value of the reference voltage $-V_{refx2}$ is being charged, is switched to the reference voltage $V_{refx1}$, and other switches 31 are respectively brought to an OPEN state. When, for example, the value of the reference voltage $-V_{refx2}$ is $+V_{ref}$ FIG. 16(c) becomes FIG. 16(d) and only the switch 31 coupled to the capacitor Cx1a is switched and coupled to the reference voltage $V_{refx1}$. Other capacitors Cx1b and Cx1c are respectively brought to an OPEN state. Owing to this operation, charge transfer occurs due to the capacitor Cx1a alone and an electrical charge of $-C \cdot (V_{refx1} - V_{ref}) = -C \cdot (V_{refx1} + V_{refx2})$ is transferred. This is equal to the transfer of electrical charges, which occurs in FIG. 15(a). Incidentally, since the switches are in the OPEN state although the capacitors Cx1b and Cx1c are also coupled to the amplifier 32, no change in charge occurs and no influence is exerted on above. Since the input ends of the capacitors Cx1b and Cx1c are respectively in the OPEN state, no influence is exerted even on the feedback factor.

The MDA circuit 3 shown in FIG. 14 adopts the configuration of the capacitors Cx1a through Cx1c shown in FIG. 16(c). Therefore, the total capacitance value of the capacitors coupled to the input part of the amplifier 32 is reduced in the MDA circuit 3 according to the present embodiment as compared with the MDA circuit 3 according to the second embodiment. Consequently, the feedback factor rises as expressed in the following equation (6):

$$\text{feedback factor } \beta = \frac{1}{2^{N-3} + \frac{Cpara}{Cfb} + \frac{2}{4}} = \frac{1}{2^{N-3}\left[1 + \frac{Cpara}{Csamp}\right] + \frac{1}{2}} \quad (6)$$

Fourth Embodiment

Figure 17:
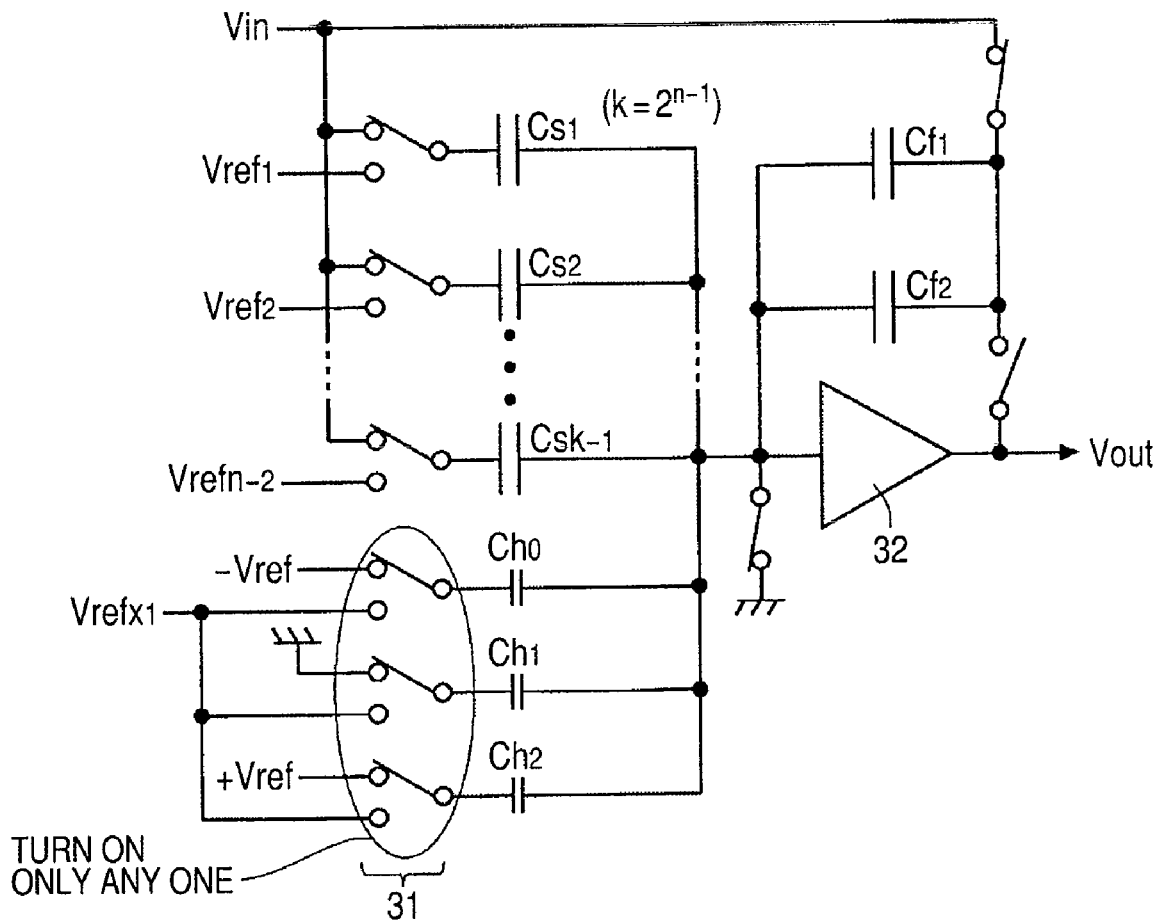
FIG. 17 is a circuit diagram of an MDA circuit of a pipeline type A/D converter according to a fourth embodiment of the present invention.

A pipeline type A/D converter according to the present embodiment is of the pipeline type A/D converter of the flip around type shown in the second embodiment except that the MDA circuit 3 shown in FIG. 12 is changed to an MDA circuit 3 shown in FIG. 17. In the pipeline type A/D converter according to the present embodiment, the description of those other than the MDA circuit 3 shown in FIG. 14 will therefore be omitted. The present embodiment adopts such a configuration that the configurations of the capacitors described in the third embodiment are developed to the MDA circuit 3 shown in FIG. 12.

In the MDA circuit 3 shown in FIG. 12, one capacitor Cx1 charged to 0V has been coupled. Therefore, the increase in feedback factor has been suppressed because the capacitors coupled to the input node of the amplifier 32 increases in number as compared with the MDA circuit 3 shown in FIG. 5. Thus, the MDA circuit 3 shown in FIG. 17 of the present embodiment is provided with capacitors Ch0 through Ch2 in place of the capacitor Cx1 to achieve a further improvement in feedback factor. Incidentally, the capacitor Ch0 is charged to a reference voltage $-V_{ref}$, the capacitor Ch1 is charged to 0V and the capacitor Ch2 is charged to a reference voltage $+V_{ref}$ respectively.

Figure 18A:
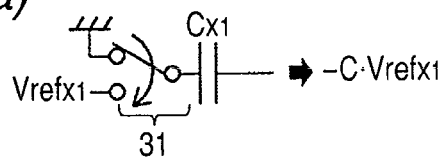
FIG. 18 is a diagram for describing a configuration of the MDA circuit of the pipeline type A/D converter according to the fourth embodiment of the present invention.
Figure 18B:
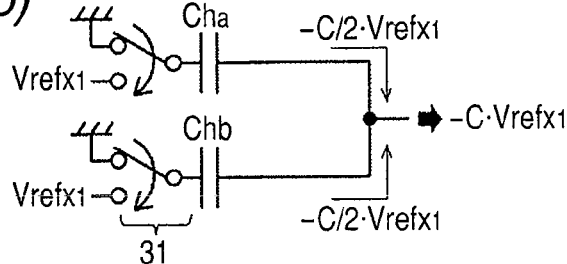

Incidentally, although the MDA circuit 3 shown in FIG. 13, which has been equipped with the three capacitors of Cx1 through Cx3, has been improved in the third embodiment, the present embodiment is different therefrom in that the MDA circuit 3 shown in FIG. 12, which has been equipped with one capacitor Cx1 is improved. Thus, in the present embodiment, each of the capacitors Ch0 through Ch2 shown in FIG. 17 is a capacitance value equal to half the capacitance value of the capacitor Cx1. Namely, a capacitor Cx1 shown in FIG. 18(a) is divided into two capacitors Cha and Chb shown in FIG. 18(b). With the coupling of these capacitors Cha and Chb, the arithmetic operation described in the third embodiment can be performed as shown in FIG. 18(c) (arithmetic operation equivalent to FIG. 16(b)).

Figure 18C:
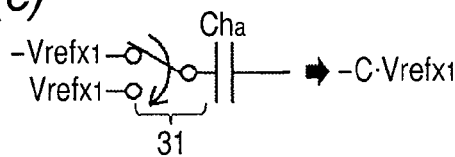

Since the capacitance value is reduced to half (assuming that, for example, the capacitance value of the capacitor Cx1 is C, the capacitance value of the capacitor Cha or the like becomes C/2) in FIG. 18(c) with respect to FIG. 18(a), the capacitance coupled to the amplifier 32 is reduced so that the feedback factor is improved. As described in the third embodiment, however, the capacitors Ch0 through Ch2 are prepared for its realization even in FIG. 18(c) to make such a configuration as shown in FIG. 18(d) (arithmetic operation equivalent to FIG. 16(c)).

Figure 18D:
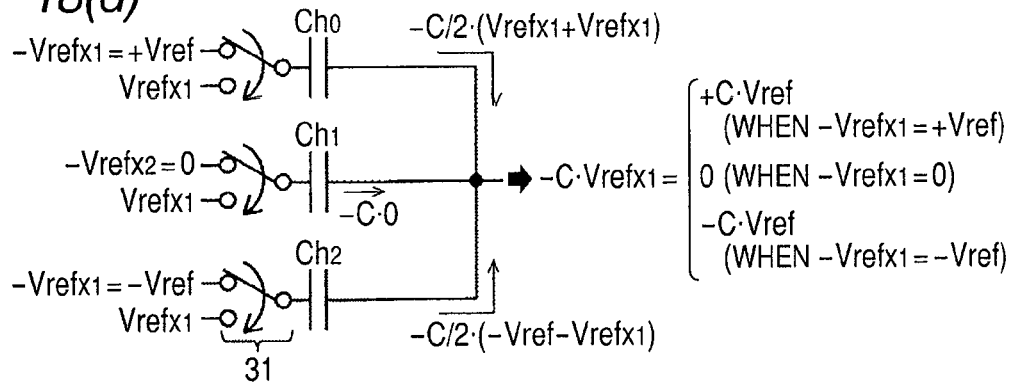
Figure 18E:
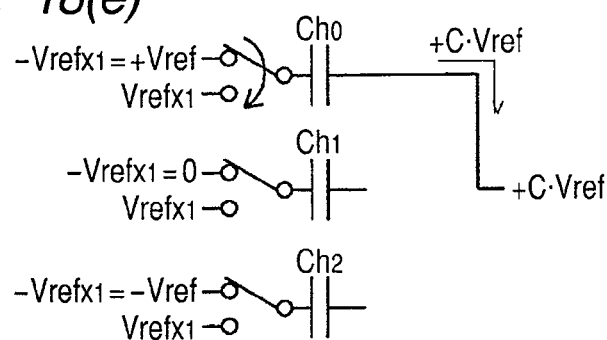

In FIG. 18(d), the three capacitors Ch0 through Ch2 are prepared and potentials of $+V_{ref}$, 0 and $-V_{ref}$ are respectively charged thereto upon sampling. Thereafter, any of the capacitors Ch0 through Ch2 is used when the value of a reference voltage $-V_{refx1}$ is decided. Namely, the capacitor Ch0 is used when the reference voltage $-V_{refx1}$ is $+V_{ref}$ the capacitor Ch1 is used when the reference voltage $-V_{refx1}$ is 0, and the capacitor Ch2 is used when the reference voltage $-V_{refx1}$ is $-V_{ref}$ respectively.

As a concrete operation, any of the switches 31, which is coupled to the capacitor to which the potential corresponding to the value of the reference voltage $-V_{refx1}$ is being charged, is switched to the reference voltage $V_{refx1}$, and other switches 31 are respectively brought to an OPEN state. When, for example, the value of the reference voltage $-V_{refx1}$ is $+V_{ref}$, FIG. 18(*d*) becomes FIG. 18(*e*) and only the switch 31 coupled to the capacitor Ch0 is switched and coupled to the reference voltage $V_{refx1}$. Other capacitors Ch1 and Ch2 are respectively brought to an OPEN state. Owing to this operation, charge transfer occurs due to the capacitor Ch0 alone and an electrical charge of $-(C/2)\cdot(V_{refx1}+V_{refx1})=-C\cdot V_{ref}$ is transferred. This is equal to the transfer of electrical charges, which occurs in FIG. 18(*a*). Incidentally, since the switches are in the OPEN state although the capacitors Ch1 and Ch2 are also coupled to the amplifier 32, no change in charge occurs and no influence is exerted on above. Since the input ends of the capacitors Ch1 and Ch2 are respectively in the OPEN state, no influence is exerted even on the feedback factor.

The MDA circuit 3 shown in FIG. 17 adopts the configuration of the capacitors Ch0 through Ch2 shown in FIG. 18(*d*). Therefore, the total capacitance value of the capacitors coupled to the input part of the amplifier 32 is reduced in the MDA circuit 3 according to the present embodiment as compared with the MDA circuit 3 according to the second embodiment. Consequently, the feedback factor rises as expressed in the following equation (7):

$$\text{feedback factor } \beta = \frac{1}{2^{N-2} + \frac{Cpara}{Cfb} + \frac{1}{4}} = \frac{1}{2^{N-2}\left[1 + \frac{Cpara}{Csamp}\right] + \frac{1}{4}} \quad (7)$$

Fifth Embodiment

Figure 19:
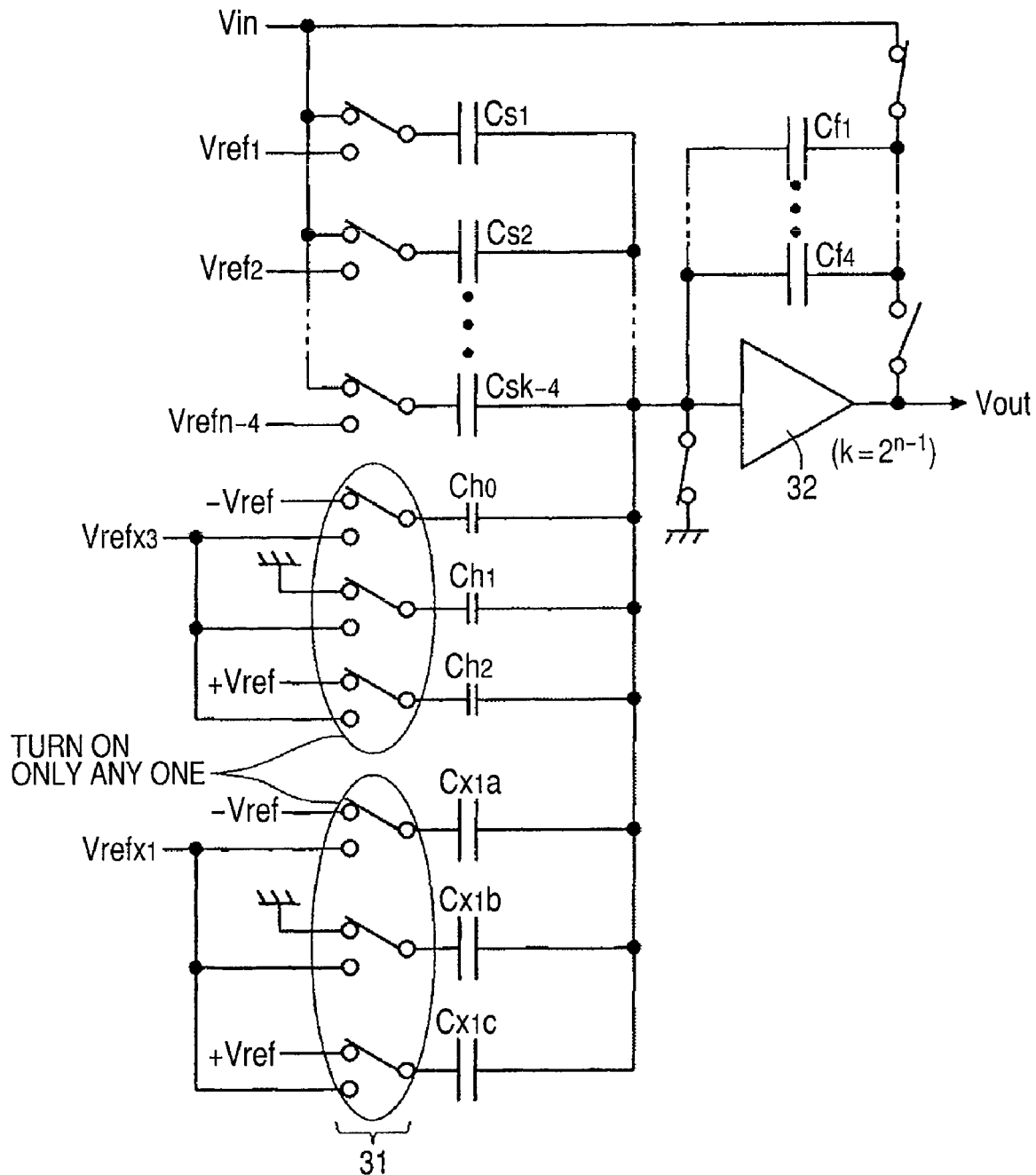
FIG. 19 is a circuit diagram of an MDA circuit of a pipeline type A/D converter according to a fifth embodiment of the present invention.

A pipeline type A/D converter according to the present embodiment is of the pipeline type A/D converter of the flip around type shown in the third embodiment except that the MDA circuit 3 shown in FIG. 14 is changed to an MDA circuit 3 shown in FIG. 19. In the pipeline type A/D converter according to the present embodiment, the description of those other than the MDA circuit 3 shown in FIG. 19 will therefore be omitted. The configuration of capacitors according to the present embodiment corresponds to a configuration in which the MDA circuit 3 shown in FIG. 14 and the MDA circuit 3 shown in FIG. 17 are combined together.

In the MDA circuit 3 shown in FIG. 14, the capacitor Cx3 coupled to the first reference signal has always been coupled to 0V. In the MDA circuit shown in FIG. 19, however, the three capacitors Ch0 through Ch2 shown in FIG. 17 whose capacitance values have been set to half, are prepared in place of the capacitor Cx3, and a predetermined potential $V_{ref}$ is charged to the capacitors Ch0 through Ch2 in advance respectively. When the value of a reference voltage $V_{refx3}$ is decided by the sub AD circuit, the corresponding capacitor of the capacitors Ch0 through Ch2 is coupled to the reference voltage $V_{refx3}$ and the input parts of other capacitors are respectively brought to an OPEN state. Thus, in the MDA circuit shown in FIG. 19, the total capacitance value of the capacitors coupled to their corresponding input part of an amplifier 32, which influences a feedback factor, can be reduced as compared with the MDA circuit 3 shown in FIG. 14. It is further possible to improve or increase the feedback factor and achieve a reduction in current consumption as expressed in the following equation (8):

$$\text{feedback factor } \beta = \frac{1}{2^{N-3} + \frac{Cpara}{Cfb} + \frac{1}{4} + \frac{1}{8}} = \frac{1}{2^{N-3}\left[1 + \frac{Cpara}{Csamp}\right] + \frac{3}{8}} \quad (8)$$

Sixth Embodiment

Figure 20:
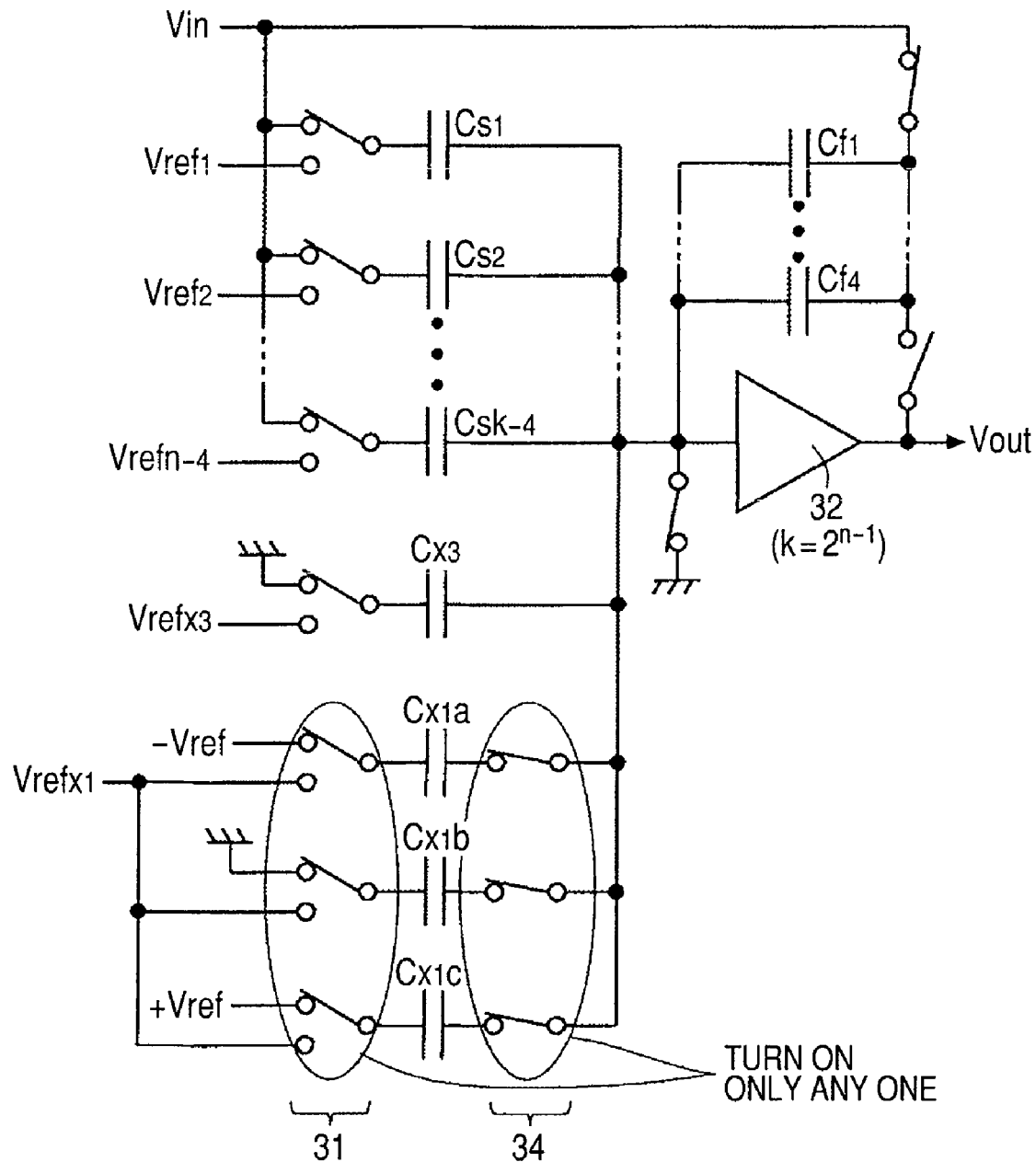
FIG. 20 is a circuit diagram of an MDA circuit of a pipeline type A/D converter according to a sixth embodiment of the present invention.

In the MDA circuit 3 shown in FIG. 14, one ends of the four capacitors Cx1*a* through Cx1*c* and Cx3 have always been coupled to the input terminal of the amplifier 32. In an MDA circuit 3 adopted in a pipeline type A/D converter according to the present embodiment, however, switches 34 are provided between one ends of capacitors Cx1*a* through Cx1*c* and both one end of a capacitor Cx3 and an input terminal of an amplifier 32 as shown in FIG. 20. Thus, the parasitic capacitance produced in the input node of the amplifier 32 can be reduced and the feedback factor can be raised. Further, since the floating node large in area, which has been provided in the MDA circuit 3 shown in FIG. 14, becomes unnecessary, noise immunity can be enhanced.

Figure 21:
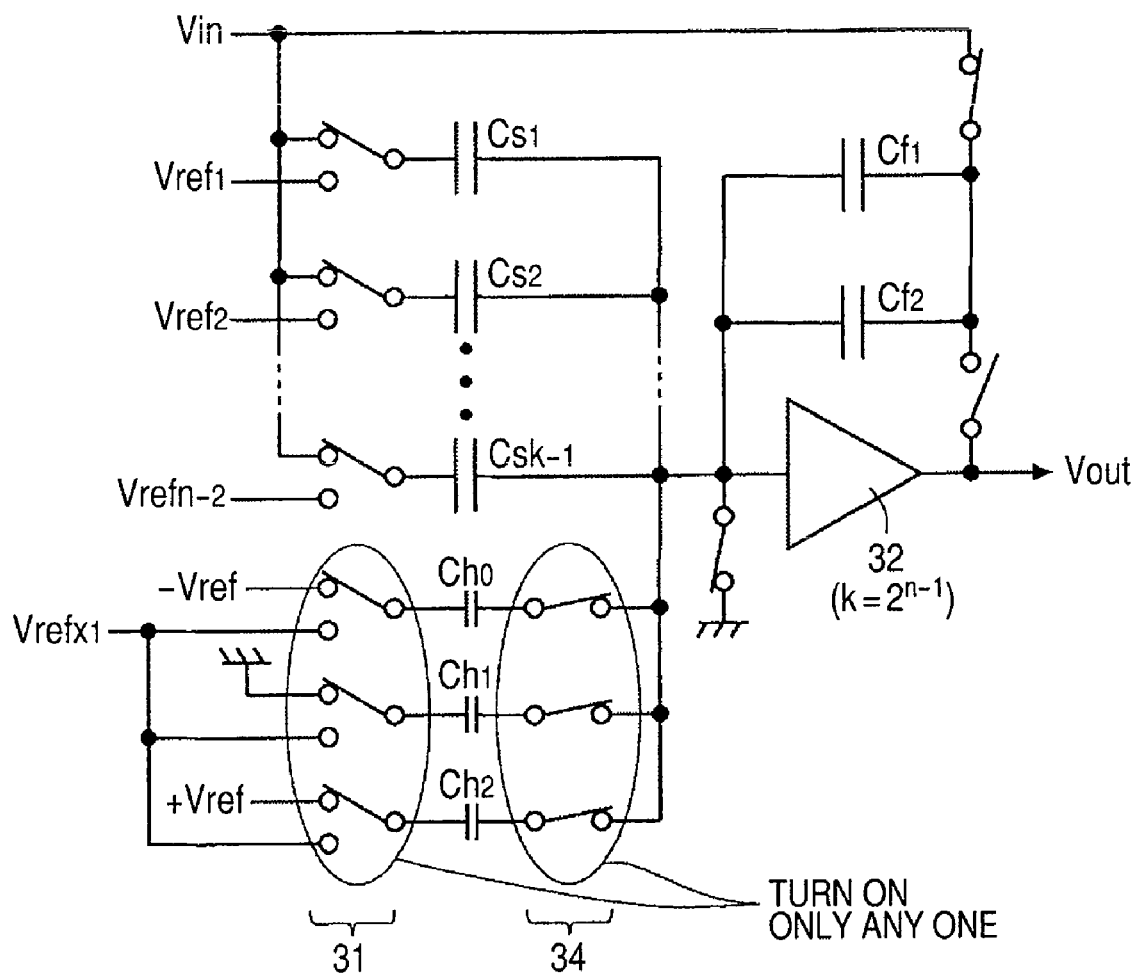
FIG. 21 is circuit diagram of another MDA circuit of the pipeline type A/D converter according to the sixth embodiment of the present invention.

Adopting the above configuration in the MDA circuit 3 shown in FIG. 17 in like manner yields an MDA circuit shown in FIG. 21. Switches 34 are provided between one ends of the capacitors Ch0 through Ch2 and the input terminal of the amplifier 32.

Figure 22:
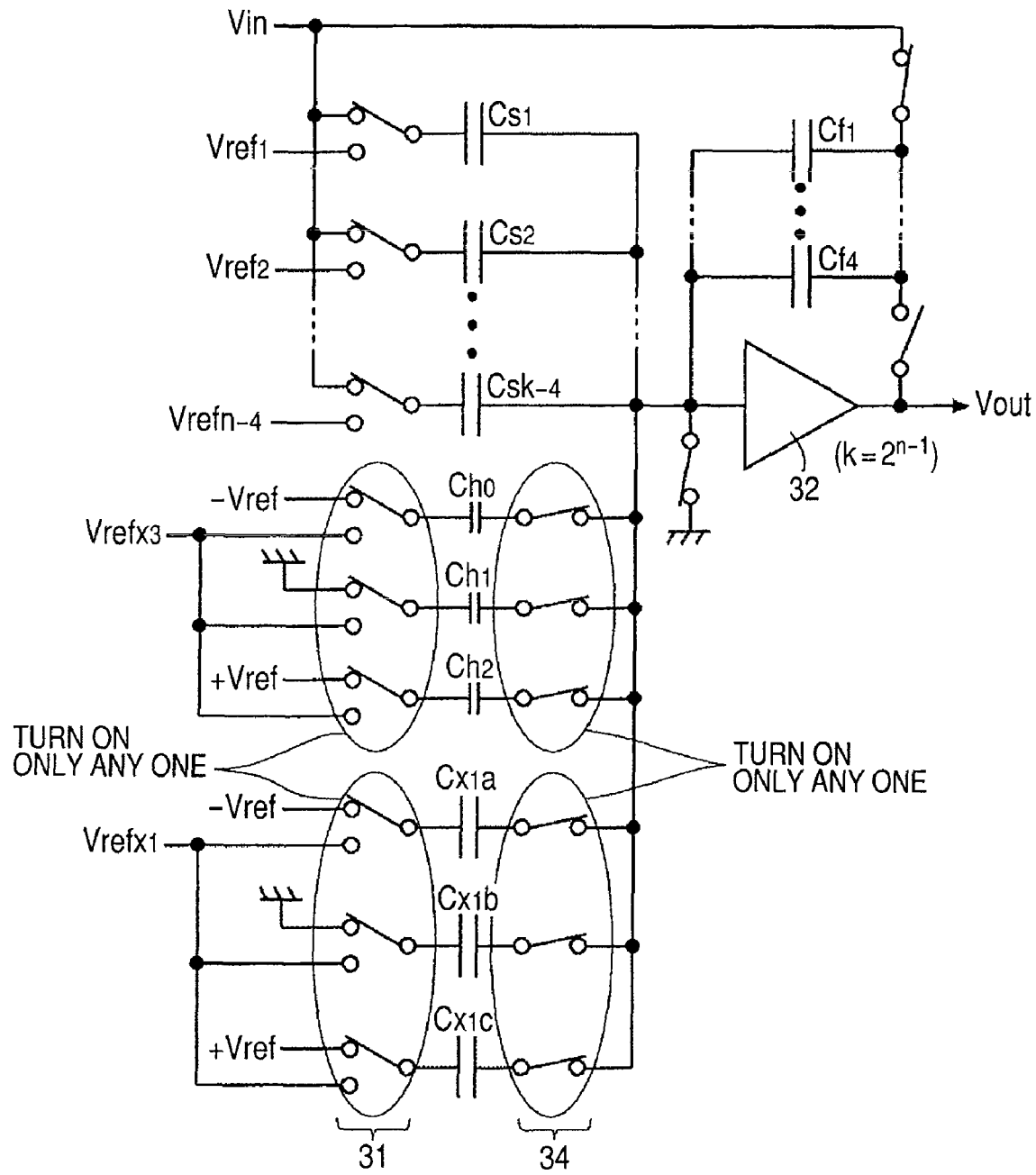
FIG. 22 is a circuit diagram of a further MDA circuit of the pipeline type A/D converter according to the sixth embodiment of the present invention.

Further, when the above configuration is adopted in the MDA circuit 3 shown in FIG. 19, an MDA circuit 3 shown in FIG. 22 is obtained. Switches 34 are provided between one ends of both the capacitors Ch0 through Ch2 and the capacitors Cx1*a* through Cx1*c* and the input terminal of the amplifier 32.

Seventh Embodiment

Figure 23:
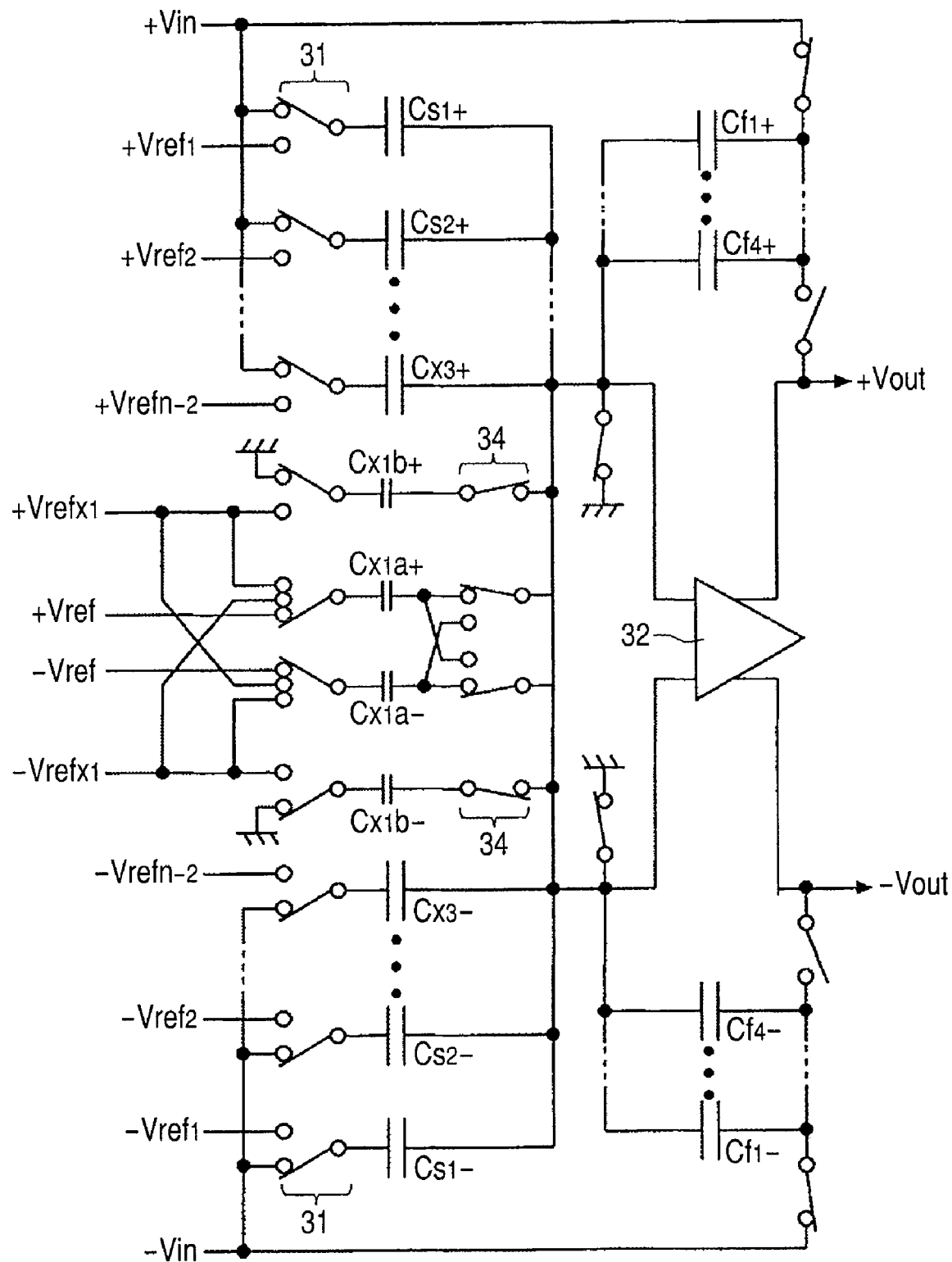
FIG. 23 is a circuit diagram of an MDA circuit of a pipeline type A/D converter according to a seventh embodiment of the present invention.

A pipeline type A/D converter according to the present embodiment adopts an MDA circuit 3 shown in FIG. 23 in which the MDA circuit 3 shown in FIG. 20 is brought to a differential configuration, in place of the adoption of the MDA circuit shown in FIG. 20.

In the MDA circuit 3 shown in FIG. 23, the two positive and negative MDA circuits 3 each shown in FIG. 20 are prepared and combined together to allow capacitors Cx1*a* and Cx1*b* to be shared between their differentials, thus making it possible to reduce the capacitance (capacitor Cx1*c*). Consequently, the area of a circuit that forms each capacitor can be reduced.

The operation of the MDA circuit 3 shown in FIG. 23 will be explained specifically using FIGS. 24(*a*) and 24(*b*). In FIGS. 24(*a*) and 24(*b*), only the capacitors corresponding to some of the MDA circuit 3 are described and other configurations are omitted. First assume that the MDA circuits 3 each shown in FIG. 20 are arranged so as to take the differential configuration. In doing so, the capacitors Cx1*a*, Cx1*b* and Cx1*c* are arranged as two sets as shown in FIG. 24(*a*). In order to make a distinction between their differentials, the capacitors on the positive phase side are assumed to be Cx1*a*+, Cx1*b*+ and Cx1*c*+ and the capacitors on the negative phase side are assumed to be Cx1*a*−, Cx1*b*− and Cx1*c*−, respectively. Further, in the same manner as when described in FIG. 18(*d*), the respective capacitors on the positive and negative phase sides are coupled by their corresponding switches 31 so as to be capable of storing electrical charges each corresponding to a reference voltage $-V_{refx2}$. Other switches 31 are respectively brought to an OPEN state and not used at all.

When the reference voltage $-V_{refx2}$ is now $+V_{ref}$, such coupling as shown in FIG. 24(*b*) is taken. Hence, the capacitors Cx1a+ and Cx1a− are used and other capacitors Cx1b+, cx1b−, Cx1c+ and Cx1c− are not used. When attention is paid to the unused capacitor Cx1c− at this time, the capacitor Cx1c− is charged to the potential of $+V_{ref}$ upon sampling and identical in potential to the capacitor Cx1a+. When attention is next paid to the unused capacitor Cx1c+, the capacitor Cx1c+ is charged to the potential of $-V_{ref}$ upon sampling and identical in potential to the capacitor Cx1a−.

Figure 24A:
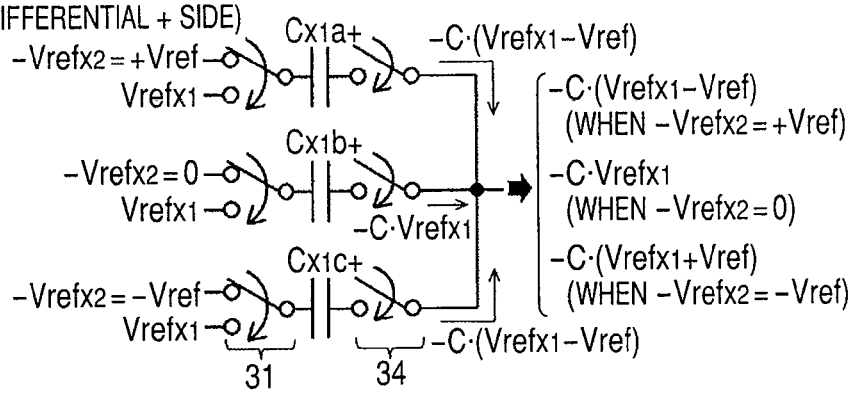
FIG. 24 is diagram for describing a configuration of the MDA circuit of the pipeline type A/D converter according to the seventh embodiment of the present invention.
Figure 24A:
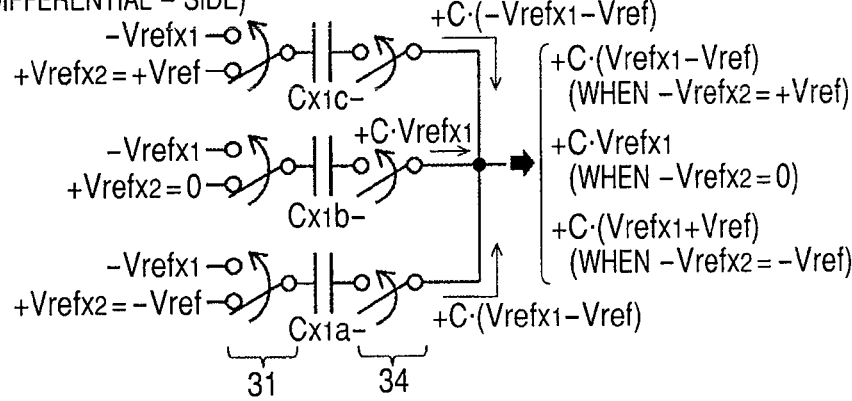
Figure 24B:
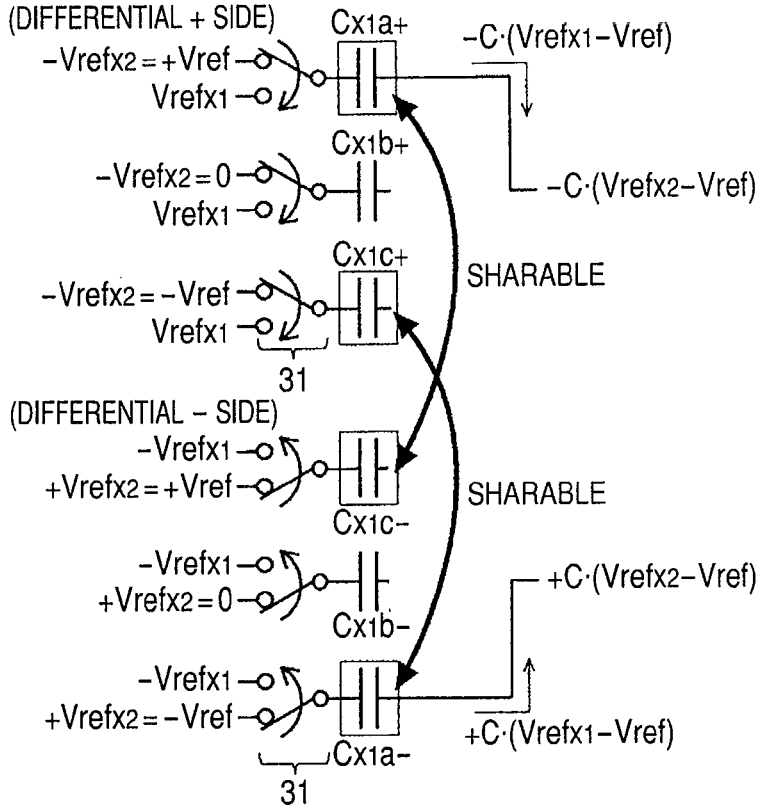

When the reference voltage $-V_{refx2}$ is $-V_{ref}$ in reverse, only the capacitors Cx1c+ and Cx1c− are used and the remaining capacitors Cx1a+, Cx1a−, Cx1b+ and Cx1b− are not used in FIG. 24(a). When attention is paid to the unused capacitor Cx1a+ at this time, the capacitor Cx1a+ is charged to the potential of $+V_{ref}$ upon sampling and identical in potential to the capacitor Cx1c−. When attention is next paid to the unused capacitor Cx1a−, the capacitor Cx1a− is charged to the potential of $-V_{ref}$ upon sampling and identical in potential to the capacitor Cx1c+.

Namely, there is established the relation in which when either the pair of the capacitors Cx1a+ and Cx1a− or the pair of the capacitors Cx1c+ and Cx1c− is used, the other is not utilized. The same potential is charged to both pairs. Consequently, the capacitors Cx1a+ and Cx1a− and the capacitors Cx1c+ and Cx1c− can be shared by controlling both pairs. Thus, as in the MDA circuit 3 shown in FIG. 23, the capacitors Cx1a+ and Cx1a− can be made couplable even to both the potential of $+V_{ref}$ and the potential of $-V_{ref}$ using switches 31 and 34 coupled to both capacitors thereby to share the capacitors Cx1c+ and Cx1c− with the capacitors Cx1a+ and Cx1a−. Thus, the pipeline type A/D converter according to the present embodiment can reduce a circuit area as compared with a circuit configuration simply brought to differentiation.

Eighth Embodiment

Figure 25:
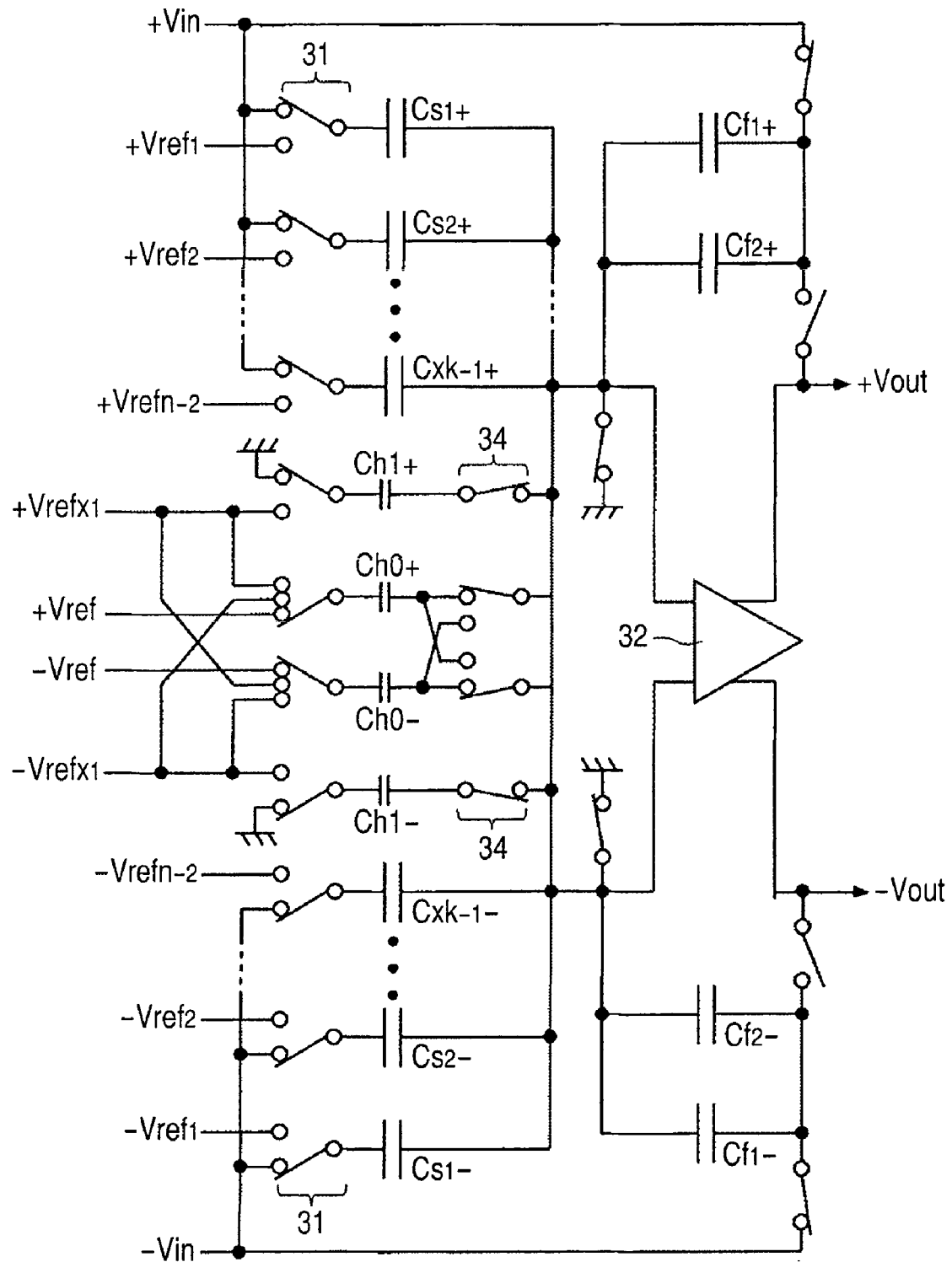
FIG. 25 is a circuit diagram of an MDA circuit of a pipeline type A/D converter according to an eighth embodiment of the present invention.

A pipeline type A/D converter according to the present embodiment adopts an MDA circuit 3 shown in FIG. 25 in which the differential configuration adopted in the MDA circuit 3 of FIG. 23 is applied to the MDA circuit 3 of FIG. 21.

Namely, in the MDA circuit 3 shown in FIG. 25, capacitors Ch0, Ch1 and Ch2 are assumed to be capacitors Ch0+, Ch1+ and Ch2+ on the positive phase side and capacitors Ch0−, Ch1− and Ch2− on the negative phase side and charged to the same potential respectively. Further, the capacitors Ch0+ and Ch0− and the capacitors Ch2+ and Ch2− used only exclusively each other are shared.

Described specifically, as in the MDA circuit 3 shown in FIG. 25, the capacitors Ch0+ and Ch0− can be made couplable even to both a potential of $+V_{ref}$ and a potential of $-V_{ref}$ using switches 31 and 34 coupled to the capacitors Ch0+ and Ch0− thereby to share the capacitors Ch0+ and Ch0− with the capacitors Ch2+ and Ch2−. Thus, the pipeline type A/D converter according to the present embodiment can reduce a circuit area as compared with simply brought to differentiation.

Ninth Embodiment

In a pipeline type A/D converter according to the present embodiment, AD conversion cannot be suitably performed when an input signal larger than a predetermined value is inputted. Thus, in the pipeline type A/D converter according to the present embodiment, a circuit for taking overflow measures is added to the pipeline type A/D converter according to the above embodiment.

Figure 26:
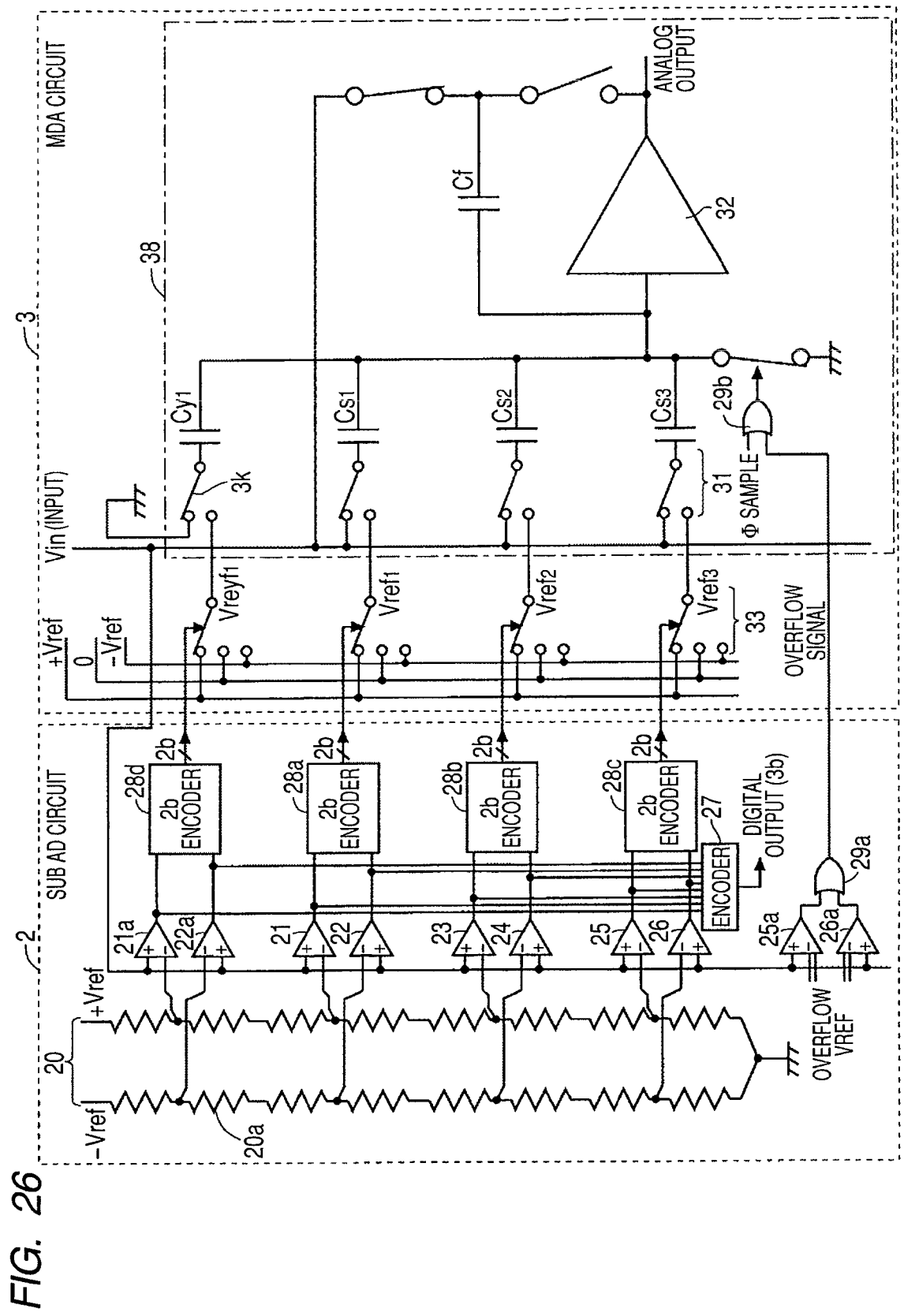
FIG. 26 is a circuit diagram of a stage of a pipeline type A/D converter according to a ninth embodiment of the present invention.

Described concretely, FIG. 26 shows a circuit diagram in which a circuit for taking overflow measures is added to the pipeline type A/D converter shown in FIG. 6. The pipeline type A/D converter shown in FIG. 26 is of a flip around type. The pipeline type A/D converter shown in FIG. 26 is equipped with comparators 21a, 22a, 25a and 26a, a 2-bit encoder 28d, a capacitor Cy1 and OR circuits 29a and 29b as for the circuit for taking the overflow measures.

The 2-bit encoder 28d encodes the results of output of the comparators 21a and 22a. The capacitor Cy1 stores therein a potential selected based on the output of the 2-bit encoder 28d. A switch 31a that performs switching between a reference potential $V_{refy1}$ and GND is also additionally provided at the capacitor Cy1. The comparators 25a and 26a compare an input signal $V_{in}$ and a VREF signal for overflow. The OR circuits 29a and 29b calculate exclusive ORing of the output results of the comparators 25a and 26a and control switches for coupling a capacitor Cs1 and the like and GND.

Figure 27:
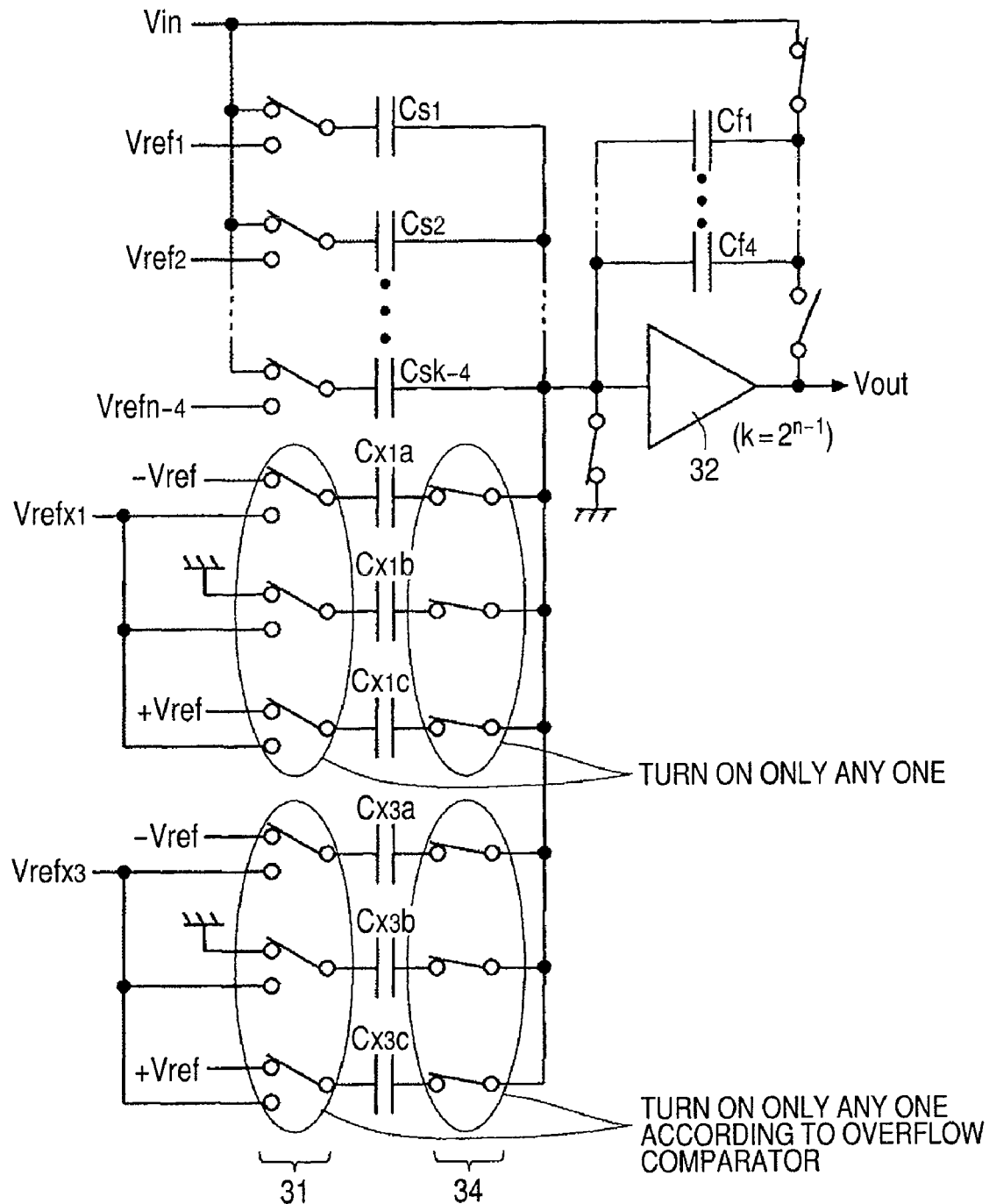
FIG. 27 is a circuit diagram of an MDA circuit of the pipeline type A/D converter according to the ninth embodiment of the present invention.

Further, as to a part or unit 38 surrounded by a broken line in a stage shown in FIG. 26, the capacitor Cx3 shown in FIG. 14 and the capacitor Cy1 shown in FIG. 26 are shared using the MDA shown in FIG. 14 and the method described in the fourth embodiment to make a circuit configuration of an MDA circuit 3 shown in FIG. 27. In the MDA circuit 3 shown in FIG. 27, the capacitor Cx3 is provided as capacitors Cx3a, Cx3b and Cx3c to share the capacitor Cy1. Any one of the capacitors Cx3a, Cx3b and Cx3c is coupled to an amplifier 32, based on the outputs of the comparators 25a and 26a for overflow. Incidentally, any one of capacitors Cx1a, Cx1b and Cx1c is coupled to the amplifier 32 according to a reference potential $V_{refn-1}$. In FIG. 27, switches 31 and 34 are used as coupling means.

Figure 28:
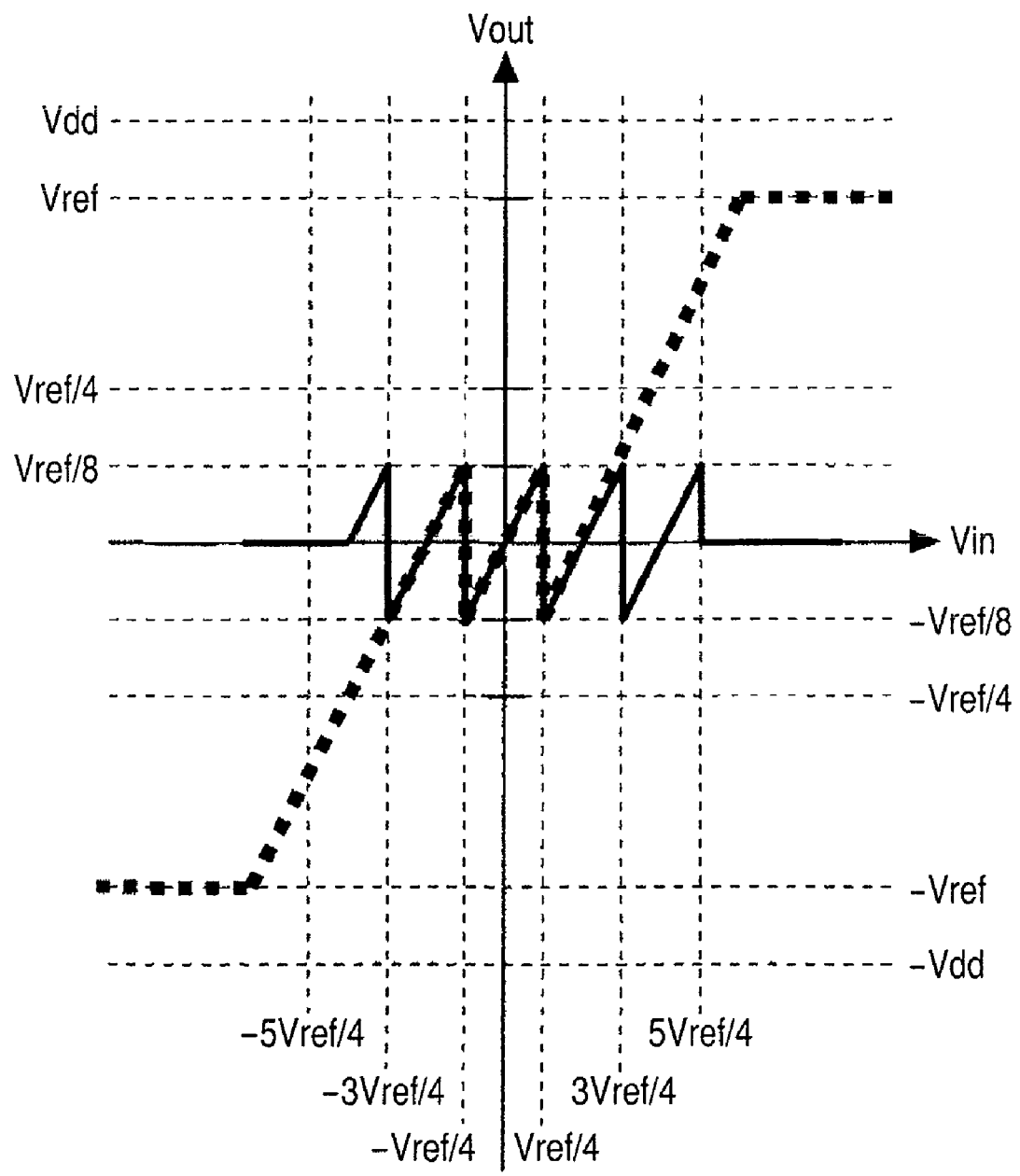
FIG. 28 is a diagram showing a transfer function of the pipeline type A/D converter according to the ninth embodiment of the present invention.

A transfer function becomes a function indicated by a solid line shown in FIG. 28 by using the MDA circuit 3 shown in FIG. 27. Incidentally, a function indicated by a broke line shown in FIG. 28 is of a function where a circuit for taking overflow measures is not used in the circuit configuration of the MDA circuit 3 shown in FIG. 27. The number of returns increases. Namely, the number of returns for the transfer function ranges from $2^N-2$ to $2^N$. In FIG. 28, the number of returns increases from 6 times to 8 times with N=3.

Figure 29:
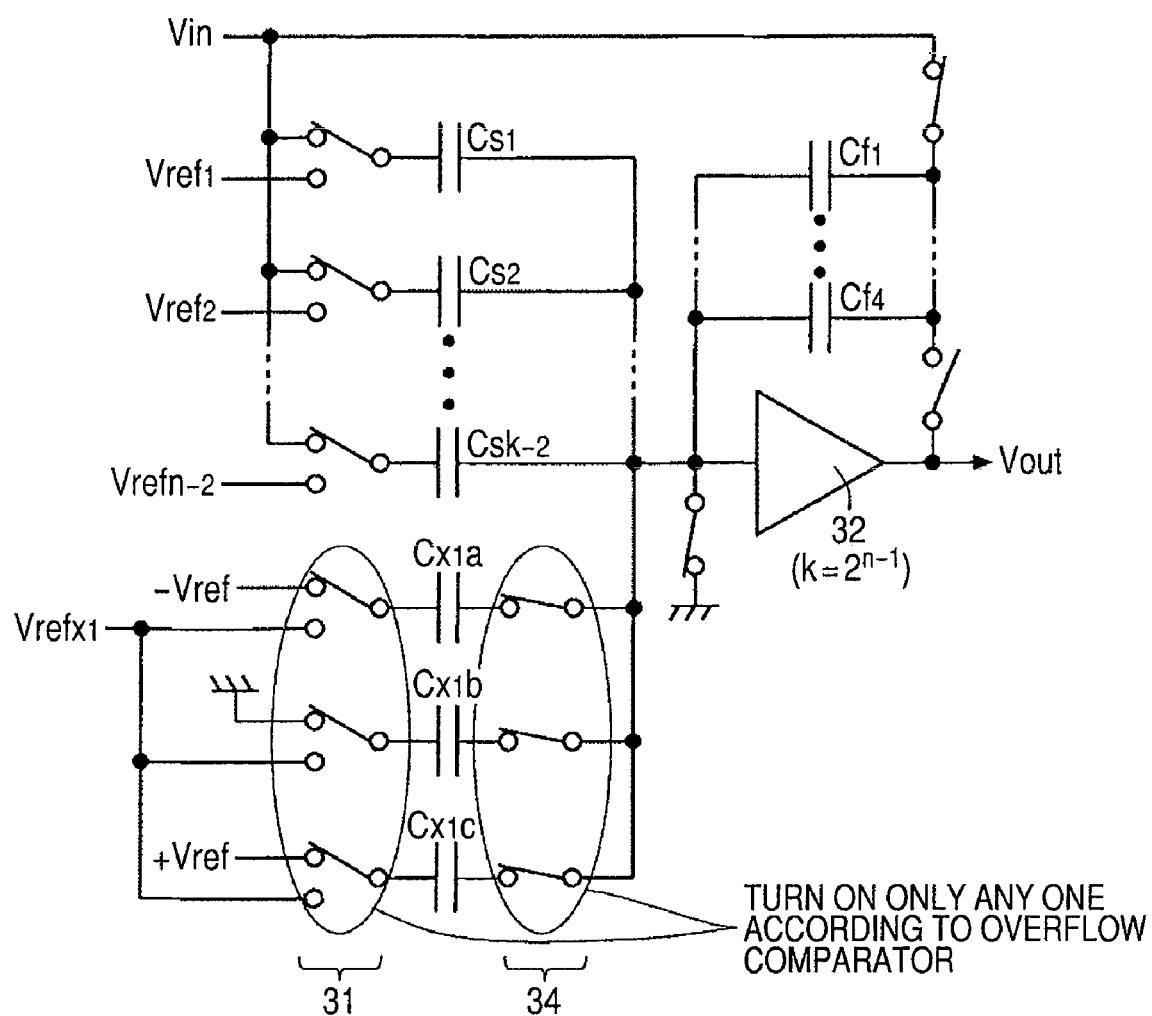
FIG. 29 is a circuit diagram of another MDA circuit of the pipeline type A/D converter according to the ninth embodiment of the present invention.

As to the part 38 surrounded by the broken line in the stage shown in FIG. 26, the capacitor Cx1 shown in FIG. 12 and the capacitor Cy1 shown in FIG. 26 are shared using the MDA shown in FIG. 12 and the method described in the fourth embodiment to make a circuit configuration of an MDA circuit 3 shown in FIG. 29. In the MDA circuit 3 shown in FIG. 29, the capacitor Cx1 is provided as capacitors Cx1a, Cx1b and Cx1c to share the capacitor Cy1.

Figure 30:
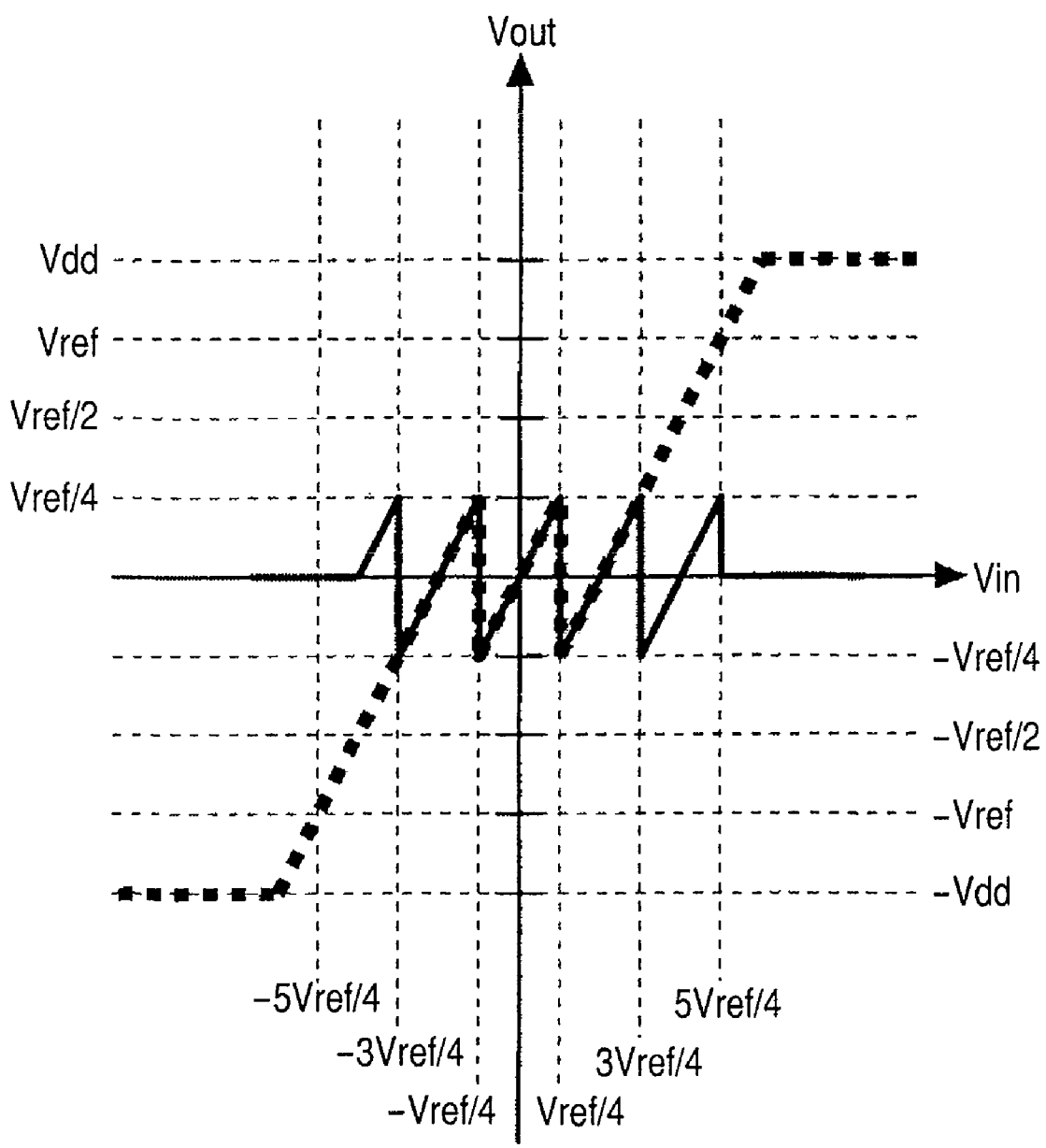
FIG. 30 is a diagram showing another transfer function of the pipeline type A/D converter according to the ninth embodiment of the present invention.

A transfer function becomes a function indicated by a solid line shown in FIG. 30 by using the MDA circuit 3 shown in FIG. 29. Incidentally, a function indicated by a broke line shown in FIG. 30 is of a function where a circuit for taking overflow measures is not used in the circuit configuration of the MDA circuit 3 shown in FIG. 29. The number of returns increases. Namely, the number of returns for the transfer function ranges from $2^N-2$ to $2^N$. In FIG. 28, the number of returns increases from 6 times to 8 times with N=3. In the transfer function of FIG. 30, the stage gain is set twice as compared with the transfer function of FIG. 28.

As to the circuit for taking the overflow measures described in the present embodiment, a charge transfer type described in Japanese Patent Application No. 2006-151603 is converted to a flip around type, which is used.

In the pipeline type A/D converter according to the present embodiment as described above, the overflow circuit can be introduced without adding the capacitors. It is therefore possible to reduce the area of the circuit configuration.

Incidentally, the pipeline type A/D converter described in each of the above embodiments is of a circuit formed over a semiconductor substrate.

What is claimed is:

1. A pipeline type A/D converter which converts an analog signal to a digital signal, comprising:
a plurality of stages coupled in tandem; and
an error correction circuit which generates the digital signal, based on sub digital signals respectively outputted from the stages,
wherein at least one of the stages, outputting the sub digital signal of N bits has a stage gain of a transfer function of $2^{N-K-1}$, and the number of returns of $2^N-2$, where N and K are integers having a relation of $1 \leq K \leq N$.

2. A pipeline type A/D converter which converts an analog signal to a digital signal, comprising:
a plurality of stages coupled in tandem; and
an error correction circuit which generates the digital signal, based on sub digital signals respectively outputted from the stages,
wherein at least one of the stages, outputting the sub digital signal of N bits, has a stage gain of a transfer function of $2^{N-K-1}$, and the number of returns of $2^N$, where N and K are integers having a relation of $1 \leq K \leq N$.

3. The pipeline type A/D converter according to claim 1,
wherein the at least one stage includes a sub AD circuit which converts the analog signal to the sub digital signals and outputs the same to the error correction circuit, and a DA circuit which generates the analog signal and sub analog signals having levels corresponding to the sub digital signals generated at the sub AD circuit and outputs the same to the stage corresponding to the following stage,
wherein the DA circuit includes a plurality of capacitors coupled to reference voltages corresponding to the analog signal according to the sub digital signals generated at the sub AD circuit, an amplifier which amplifies the outputs of the capacitors, and feedback capacitors coupled to the input/output of the amplifier, and
wherein the capacitors are provided $2^N$ and the feedback capacitors are provided $2^{K+1}$.

4. The pipeline A/D converter according to claim 1, wherein the integer K is 1.

5. The pipeline type A/D converter according to claim 4,
wherein the at least one stage includes a sub AD circuit which converts the analog signal to the sub digital signals and outputs the same to the error correction circuit, and a DA circuit which generates the analog signal and sub analog signals having levels corresponding to the sub digital signals generated at the sub AD circuit and outputs the same to the stage corresponding to the following stage,
wherein the DA circuit includes a plurality of first capacitors coupled to reference voltages corresponding to the analog signal according to the sub digital signals generated at the sub AD circuit, an amplifier which amplifies the outputs of the first capacitors, and feedback capacitors coupled to the input/output of the amplifier, and
wherein the first capacitors are provided $2^{N-1}$ and the two of the first capacitors are used as the feedback capacitors.

6. The pipeline type A/D converter according to claim 5, further including one second capacitor which is charged at 0V and coupled to the corresponding reference voltage along with the first capacitors.

7. The pipeline type A/D converter according to claim 5, further including three second capacitors each having a capacitance equal to half that of the first capacitor and charged at a predetermined voltage in advance,
wherein any one of the three second capacitors is coupled to the reference voltages along with the first capacitors.

8. The pipeline type A/D converter according to claim 2, wherein the at least one stage further includes an overflow detection signal circuit which outputs an overflow detection signal according to the level of the analog signal being beyond a predetermined input voltage range.

9. The pipeline type A/D converter according to claim 1, wherein the integer K is 2.

10. The pipeline A/D converter according to claim 9,
wherein the at least one stage includes a sub AD circuit which converts the analog signal to the sub digital signals and outputs the same to the error correction circuit, and a DA circuit which generates the analog signal and sub analog signals having levels corresponding to the sub digital signals generated at the sub AD circuit and outputs the same to the stage corresponding to the following stage,
wherein the DA circuit includes a plurality of first capacitors coupled to reference voltages corresponding to the analog signal according to the sub digital signals generated at the sub AD circuit, an amplifier which amplifies the outputs of the first capacitors, and feedback capacitors coupled to the input/output of the amplifier, and
wherein the first capacitors are provided $2^{N-1}$ and the four of the first capacitors are used as the feedback capacitors.

11. The pipeline type A/D converter according to claim 10, further including three second capacitors charged at 0V and coupled to the corresponding reference voltages along with the first capacitors.

12. The pipeline type A/D converter according to claim 10, further including a plurality of second capacitors each charged at a predetermined voltage,
wherein any one of the second capacitors is coupled to the corresponding reference voltage along with the first capacitors or the second capacitors are coupled thereto in combination.

* * * * *